(12) United States Patent
Wang et al.

(10) Patent No.: US 12,362,026 B2
(45) Date of Patent: Jul. 15, 2025

(54) SHIFT REGISTER AND CONTROL METHOD THEREFOR, GATE DRIVE CIRCUIT, AND DISPLAY PANEL

(71) Applicants: Chengdu BOE Optoelectronics Technology Co., Ltd., Sichuan (CN); BOE Technology Group Co., Ltd., Beijing (CN)

(72) Inventors: Zhu Wang, Beijing (CN); Ling Shi, Beijing (CN); Yipeng Chen, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/025,633

(22) PCT Filed: Oct. 22, 2021

(86) PCT No.: PCT/CN2021/125818
§ 371 (c)(1),
(2) Date: Mar. 9, 2023

(87) PCT Pub. No.: WO2022/160802
PCT Pub. Date: Aug. 4, 2022

(65) Prior Publication Data
US 2023/0352110 A1  Nov. 2, 2023

(30) Foreign Application Priority Data
Jan. 26, 2021 (CN) .......................... 202110101630.8

(51) Int. Cl.
*G11C 19/28* (2006.01)
*G09G 3/32* (2016.01)
*H03K 19/20* (2006.01)

(52) U.S. Cl.
CPC ............... *G11C 19/28* (2013.01); *G09G 3/32* (2013.01); *G09G 2300/0819* (2013.01);
(Continued)

(58) Field of Classification Search
None
See application file for complete search history.

(56) References Cited

U.S. PATENT DOCUMENTS 7,656,382 B2 * 2/2010 Lee ..................... G09G 3/3688
377/57
2007/0079192 A1 * 4/2007 Kim ..................... G09G 3/3266
714/726
(Continued)

FOREIGN PATENT DOCUMENTS

CN 102915698 A 2/2013
CN 106601190 A 4/2017
(Continued)

OTHER PUBLICATIONS

PCT/CN2021/125818 international search report.
(Continued)

*Primary Examiner* — Andre L Matthews
(74) *Attorney, Agent, or Firm* — IPro, PLLC

(57) ABSTRACT

Provided is a shift register. The shift register comprising: an input circuit, an intermediate circuit and an output circuit; the input circuit is connected to a first power supply terminal, a second power supply terminal, an input voltage terminal and a first clock signal terminal, and the input circuit is configured to output an intermediate input signal to the intermediate circuit; the intermediate circuit is connected to the first power supply terminal, the second power supply terminal and a second clock signal terminal, and the intermediate circuit is configured to output a first node signal to the output circuit; and the output circuit is connected to the
(Continued)

first power supply terminal, the second power supply terminal, a first output terminal and a second output terminal, and the output circuit is configured to output a first output signal and a second output signal.

18 Claims, 7 Drawing Sheets

(52) U.S. Cl.
CPC ............... *G09G 2300/0842* (2013.01); *G09G 2310/0267* (2013.01); *G09G 2310/0286* (2013.01); *G09G 2320/0247* (2013.01); *H03K 19/20* (2013.01)

(56) References Cited

U.S. PATENT DOCUMENTS

| | | | |
|---|---|---|---|
| 2016/0343310 A1* | 11/2016 | Hao | G09G 3/3674 |
| 2017/0169780 A1* | 6/2017 | Zhao | G09G 3/3696 |
| 2017/0193891 A1 | 7/2017 | Park et al. | |
| 2018/0059829 A1* | 3/2018 | Chen | G06F 3/04184 |
| 2018/0182300 A1 | 6/2018 | Chen et al. | |
| 2018/0211717 A1 | 7/2018 | Feng et al. | |
| 2019/0073068 A1* | 3/2019 | Huang | G06F 3/0412 |
| 2019/0073948 A1 | 3/2019 | Wang | |
| 2019/0130856 A1* | 5/2019 | Chen | G09G 3/3648 |
| 2019/0206504 A1 | 7/2019 | Tao et al. | |
| 2019/0311691 A1* | 10/2019 | Feng | G09G 3/36 |
| 2022/0208797 A1* | 6/2022 | Lai | H01L 27/1237 |

FOREIGN PATENT DOCUMENTS

| | | |
|---|---|---|
| CN | 107564459 A | 1/2018 |
| CN | 107958649 A | 4/2018 |
| CN | 108288460 A | 7/2018 |
| CN | 108320708 A | 7/2018 |
| CN | 108538335 A | 9/2018 |
| CN | 208141796 U | 11/2018 |
| CN | 109841194 A | 6/2019 |
| CN | 112419952 A | 2/2021 |
| CN | 112634811 A | 4/2021 |
| CN | 112863586 A | 5/2021 |

OTHER PUBLICATIONS

CN202110101630.8 first office action dated Jun. 20, 2024.
CN202110101630.8 Notification to grant patent right for invention dated Aug. 1, 2024.

* cited by examiner

SHIFT REGISTER AND CONTROL METHOD THEREFOR, GATE DRIVE CIRCUIT, AND DISPLAY PANEL

CROSS-REFERENCE TO RELATED APPLICATION

This application is a US national stage of international application No. PCT/CN2021/125818, filed on Oct. 22, 2021, which claims priority to Chinese Patent Application No. 202110101630.8, filed on Jan. 26, 2021, the disclosures of which are herein incorporated by references in their entireties.

TECHNICAL FIELD

The present disclosure relates to the field of display technologies, and in particular, relates to a shift register and a method for controlling the same, a gate drive circuit, and a display panel.

BACKGROUND OF THE INVENTION

In some practices, a low temperature polycrystalline oxide (LTPO) process is adopted to replace thin film transistors sensitive to gate leakage of a driving transistor in a pixel circuit with oxide thin film transistors, and other transistors still adopt low temperature poly-silicon (LTPS) thin film transistors.

SUMMARY OF THE INVENTION

Embodiments of the present disclosure provide a shift register and a method for controlling the same, a gate drive circuit, and a display panel.

The shift register in the embodiments of the present disclosure includes: an input circuit, an intermediate circuit and an output circuit, the intermediate circuit being connected to the input circuit and the output circuit, wherein
  the input circuit is connected to a first power supply terminal, a second power supply terminal, an input voltage terminal and a first clock signal terminal, and the input circuit is configured to output an intermediate input signal to the intermediate circuit based on an input voltage signal provided by the input voltage terminal and a first clock signal provided by the first clock signal terminal;
  the intermediate circuit is connected to the first power supply terminal, the second power supply terminal and a second clock signal terminal, and the intermediate circuit is configured to output a first node signal to the output circuit based on a second clock signal provided by the second clock signal terminal and the intermediate input signal; and
  the output circuit is connected to the first power supply terminal, the second power supply terminal, a first output terminal and a second output terminal, and the output circuit is configured to output a first output signal and a second output signal based on the first node signal, wherein a potential of the first output signal and a potential of the second output signal are opposite.

In some embodiments, the input circuit includes a first NAND gate and a second NAND gate, wherein
  a first input terminal of the first NAND gate is connected to the input voltage terminal, and a second input terminal of the first NAND gate is connected to an output terminal of the second NAND gate; and
  a first input terminal of the second NAND gate is connected to an output terminal of the first NAND gate, and a second input terminal of the second NAND gate is connected to the first clock signal terminal.

In some embodiments, the intermediate circuit includes an inverter circuit and a control circuit, wherein
  the inverter circuit is connected to the first power supply terminal and the second power supply terminal, and the inverter circuit is configured to output a second node signal and a third node signal to the control circuit based on the intermediate input signal, wherein a potential of the second node signal and a potential of the third node signal are opposite; and
  the control circuit is connected to the second clock signal terminal, the first power supply terminal and the second power supply terminal, and the control circuit is configured to output the first node signal to the output circuit based on the second clock signal provided by the second clock signal terminal, the second node signal and the third node signal.

In some embodiments, the inverter circuit includes a first inverter and a second inverter, wherein
  an input terminal of the first inverter is connected to an output terminal of the input circuit, and the first inverter is configured to output the second node signal based on the intermediate input signal; and
  an input terminal of the second inverter is connected to an output terminal of the first inverter, and the second inverter is configured to output the third node signal based on the second node signal.

In some embodiments, the control circuit includes a control transistor and a transmission gate, wherein
  a gate of the control transistor is connected to the output terminal of the first inverter, a first electrode of the control transistor is connected to the first power supply terminal, and a second electrode of the control transistor is connected to an output terminal of the intermediate circuit; and
  an input terminal of the transmission gate is connected to the second clock signal terminal, a first control terminal of the transmission gate is connected to a second node, a second control terminal of the transmission gate is connected to a third node, and an output terminal of the transmission gate is connected to the output terminal the intermediate circuit.

In some embodiments, the output circuit includes a first output sub-circuit connected to the first power supply terminal and the second power supply terminal, and the first output sub-circuit includes a third inverter and a fourth inverter, wherein
  an input terminal of the third inverter is connected to a first node, an output terminal of the third inverter is connected to an input terminal of the fourth inverter, and an output terminal of the fourth inverter is connected to the first output terminal.

In some embodiments, the output circuit further includes a second output sub-circuit connected to the first power supply terminal and the second power supply terminal, and the second output sub-circuit includes a fifth inverter, a sixth inverter and a seventh inverter, wherein an input terminal of the fifth inverter is connected to a first node, an output terminal of the fifth inverter is connected to an input terminal of the sixth inverter, an output terminal of the sixth inverter is connected to an input terminal of the seventh inverter, and an output terminal of the seventh inverter is connected to the second output terminal.

In some embodiments, the input circuit includes a first input transistor, a second input transistor, a third input transistor, a fourth input transistor, a fifth input transistor, a sixth input transistor, a seventh input transistor and an eighth input transistor; wherein the first input transistor is a P-type transistor, a first electrode of the first input transistor is connected to the first power supply terminal, a second electrode of the first input transistor is connected to a first output node, and a gate of the first input transistor is connected to a second output node;

the second input transistor is a P-type transistor, a first electrode of the second input transistor is connected to the first power supply terminal, a second electrode of the second input transistor is connected to the first output node, and a gate of the second input transistor is connected to the input voltage terminal;

the third input transistor is an N-type transistor, a first electrode of the third input transistor is connected to the first output node, a second electrode of the third input transistor is connected to a first electrode of the fourth input transistor, and a gate of the third input transistor is connected to the input voltage terminal;

the fourth input transistor is an N-type transistor, a second electrode of the fourth input transistor is connected to the second power supply terminal, and a gate of the fourth input transistor is connected to the second output node;

the fifth input transistor is a P-type transistor, a first electrode of the fifth input transistor is connected to the first power supply terminal, a second electrode of the fifth input transistor is connected to the second output node, and a gate of the fifth input transistor is connected to the first output node;

the sixth input transistor is a P-type transistor, a first electrode of the sixth input transistor is connected to the first power supply terminal, a second electrode of the sixth input transistor is connected to the second output node, and a gate of the sixth input transistor is connected to the first clock signal terminal;

the seventh input transistor is an N-type transistor, a first electrode of the seventh input transistor is connected to the second output node, a second electrode of the seventh input transistor is connected to a first electrode of the eighth input transistor, and a gate of the seventh input transistor is connected to the first clock signal terminal; and the eighth input transistor is an N-type transistor, a second electrode of the eighth input transistor is connected to the second power supply terminal, and a gate of the eighth input transistor is connected to the first output node;

the intermediate circuit includes a first intermediate transistor, a second intermediate transistor, a third intermediate transistor, a fourth intermediate transistor, a control transistor, a fifth intermediate transistor and a sixth intermediate transistor; wherein the first intermediate transistor is a P-type transistor, a first electrode of the first intermediate transistor is connected to the first power supply terminal, a second electrode of the first intermediate transistor is connected to a second node, and a gate of the first intermediate transistor is connected to the second output node;

the second intermediate transistor is an N-type transistor, a first electrode of the second intermediate transistor is connected to the second node, a second electrode of the second intermediate transistor is connected to the second power supply terminal, and a gate of the second intermediate transistor is connected to the second output node;

the third intermediate transistor is a P-type transistor, a first electrode of the third intermediate transistor is connected to the first power supply terminal, a second electrode of the third intermediate transistor is connected to a third node, and a gate of the third intermediate transistor is connected to the second node;

the fourth intermediate transistor is an N-type transistor, a first electrode of the fourth intermediate transistor is connected to the third node, a second electrode of the fourth intermediate transistor is connected to the second power supply terminal, and a gate of the fourth intermediate transistor is connected to the second node;

the control transistor is a P-type transistor, a first electrode of the control transistor is connected to the first power supply terminal, a second electrode of the control transistor is connected to a first node, and a gate of the control transistor is connected to the second node;

the fifth intermediate transistor is an N-type transistor, a first electrode of the fifth intermediate transistor is connected to the first node, a second electrode of the fifth intermediate transistor is connected to the second clock signal terminal, and a gate of the fifth intermediate transistor is connected to the second node; and the sixth intermediate transistor is a P-type transistor, a first electrode of the sixth intermediate transistor is connected to the first node, a second electrode of the sixth intermediate transistor is connected to the second clock signal terminal, and a gate of the sixth intermediate transistor is connected to the third node;

the output circuit includes a first output transistor, a second output transistor, a third output transistor, a fourth output transistor, a fifth output transistor, a sixth output transistor, a seventh output transistor, an eighth output transistor, a ninth output transistor and a tenth output transistor; wherein the first output transistor is a P-type transistor, a first electrode of the first output transistor is connected to the first power supply terminal, a second electrode of the first output transistor is connected to a third output node, and a gate of the first output transistor is connected to the first node;

the second output transistor is an N-type transistor, a first electrode of the second output transistor is connected to the third output node, a second electrode of the second output transistor is connected to the second power supply terminal, and a gate of the second output transistor is connected to the first node;

the third output transistor is a P-type transistor, a first electrode of the third output transistor is connected to the first power supply terminal, a second electrode of the third output transistor is connected to the first output terminal, and a gate of the third output transistor is connected to the third output node;

the fourth output transistor is an N-type transistor, a first electrode of the fourth output transistor is connected to the first output terminal, a second electrode of the fourth output transistor is connected to the second power supply terminal, and a gate of the fourth output transistor is connected to the third output node;

the fifth output transistor is a P-type transistor, a first electrode of the fifth output transistor is connected to the first power supply terminal, a second electrode of the fifth output transistor is connected to a fourth output node, and a gate of the fifth output transistor is connected to the first node;

the sixth output transistor is an N-type transistor, a first electrode of the sixth output transistor is connected to the fourth output node, a second electrode of the sixth output transistor is connected to the second power supply terminal, and a gate of the sixth output transistor is connected to the first node;

the seventh output transistor is a P-type transistor, a first electrode of the seventh output transistor is connected to the first power supply terminal, a second electrode of the seventh output transistor is connected to a fifth output node, and a gate of the seventh output transistor is connected to the fourth output node;

the eighth output transistor is an N-type transistor, a first electrode of the eighth output transistor is connected to the fifth output node, a second electrode of the eighth output transistor is connected to the second power supply terminal, and a gate of the eighth output transistor is connected to the fourth output node;

the ninth output transistor is a P-type transistor, a first electrode of the ninth output transistor is connected to the first power supply terminal, a second electrode of the ninth output transistor is connected to the second output terminal, and a gate of the ninth output transistor is connected to the fifth output node; and the tenth output transistor is an N-type transistor, a first electrode of the tenth output transistor is connected to the second output terminal, a second electrode of the tenth output transistor is connected to the second power supply terminal, and a gate of the tenth output transistor is connected to the fifth output node.

The method for controlling a shift register in the embodiments of the present disclosure is applicable for controlling the shift register as described in any one of the above embodiments. A display cycle includes an input phase, an output phase and a reset phase sequentially, and the method for controlling the shift register includes:

in the input phase, providing, by the input circuit, a first level to the intermediate circuit based on a first level provided by the input voltage terminal and a second level provided by the first clock signal terminal, outputting, by the intermediate circuit, a second level to the output circuit based on a second level provided by the second clock signal terminal and a first level provided by the input circuit, and outputting, by the output circuit, a second level to the first output terminal and a first level to the second output terminal based on a second level provided by the intermediate circuit;

in the output phase, providing, by the input circuit, a first level to the intermediate circuit based on a second level provided by the input voltage terminal and a second level provided by the first clock signal terminal, outputting, by the intermediate circuit, a first level to the output circuit based on a first level provided by the second clock signal terminal and a first level provided by the input circuit, and outputting, by the output circuit, a first level to the first output terminal and a second level to the second output terminal based on a first level provided by the intermediate circuit; and in the reset phase, providing, by the input circuit, a second level to the intermediate circuit based on a second level provided by the input voltage terminal and a first level provided by the first clock signal terminal, outputting, by the intermediate circuit, a second level to the output circuit based on a second level provided by the second clock signal terminal and a second level provided by the input circuit, and outputting, by the output circuit, a second level to the first output terminal and a first level to the second output terminal based on a second level provided by the intermediate circuit.

The gate drive circuit in the embodiments of the present disclosure includes the shift register as described in any one of the above embodiments.

In some embodiments, the gate drive circuit includes a plurality of cascaded shift registers, wherein except a first stage of shift register, an input voltage terminal of a current stage of shift register is connected to a first output terminal of a previous stage of shift register.

In some embodiments, the gate drive circuit includes a first clock signal line, a second clock signal line, a third clock signal line, and a first shift register, a second shift register and a third shift register which are sequentially cascaded, wherein the first clock signal line is connected to a first clock signal terminal of the first shift register, and the third clock signal line is connected to a second clock signal terminal of the first shift register;

the second clock signal line is connected to a first clock signal terminal of the second shift register, and the first clock signal line is connected to a second clock signal terminal of the second shift register; and the third clock signal line is connected to a first clock signal terminal of the third shift register, and the second clock signal line is connected to a second clock signal terminal of the third shift register.

The display panel in the embodiments of the present disclosure includes a pixel circuit and the gate drive circuit as described in any one of the above embodiments, wherein the pixel circuit and the gate drive circuit are connected to each other such that the gate drive circuit provides the first output signal and the second output signal to the pixel circuit.

In some embodiments, the pixel circuit includes a first transistor, a second transistor, a third transistor, a storage capacitor, a fourth transistor, a fifth transistor, a sixth transistor, a seventh transistor and a light-emitting element, wherein a first electrode of the first transistor is connected to a first data line, a second electrode of the first transistor is connected to a first electrode of the second transistor, and a gate of the first transistor is connected to a first gate line, the first gate line being configured to receive the first output signal provided by the shift register;

one terminal of the storage capacitor is connected to a first power line, and the other terminal of the storage capacitor is connected to a gate of the second transistor;

a first electrode of the third transistor is connected to the gate of the second transistor, a second electrode of the third transistor is connected to a second electrode of the second transistor, and a gate of the third transistor is connected to a second gate line, the second gate line being configured to receive the second output signal provided by the shift register;

a first electrode of the fourth transistor is connected to an initial power line, a second electrode of the fourth transistor is connected to the gate of the second transistor, and a gate of the fourth transistor is connected to a reset control line, the reset control line being configured to receive the second output signal provided by the shift register;

a gate of the fifth transistor is connected to a light emission control line, a first electrode of the fifth transistor is connected to the first power line, and a second electrode of the fifth transistor is connected to the first electrode of the second transistor;

a gate of the sixth transistor is connected to the light emission control line, a first electrode of the sixth transistor is connected to the second electrode of the second transistor, a second electrode of the sixth transistor is connected to one end of the light-emitting element, and the other end of the light-emitting element is connected to the second power line; and a first electrode of the seventh transistor is connected to the initial power line, a second electrode of the seventh transistor is connected to the second electrode of the sixth transistor, and a gate of the seventh transistor is connected to the first gate line, the first gate line being configured to receive the first output signal provided by the shift register.

In some embodiments, the first transistor, the second transistor, the fifth transistor, the sixth transistor and the seventh transistor are P-type transistors, and the third transistor and the fourth transistor are N-type transistors

BRIEF DESCRIPTION OF DRAWINGS

The above and/or additional aspects and advantages of the present disclosure become apparent and readily understood from the following descriptions of the embodiments in conjunction with the following drawings, in which.

Figure 1:
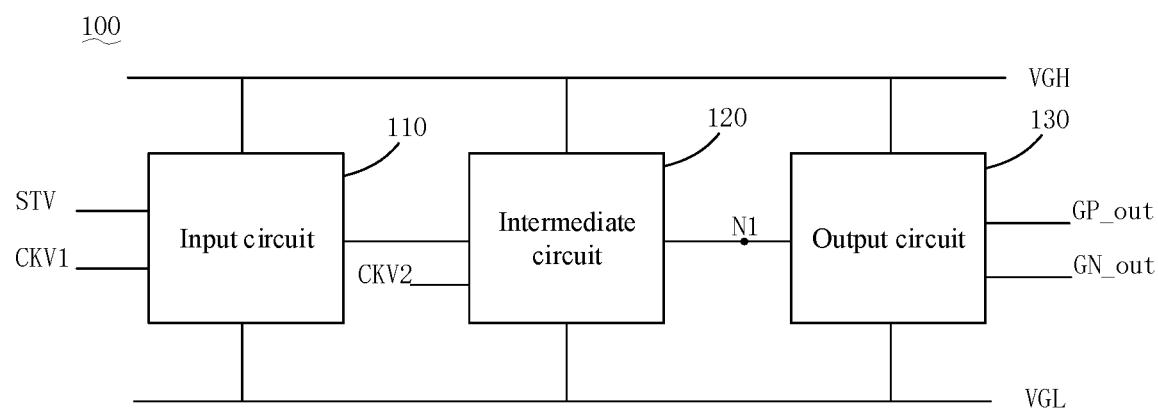
FIG. 1 is a schematic diagram of modules of a shift register according to some embodiments of the present disclosure.

MAIN ELEMENTS AND REFERENCE NUMERALS THEREOF gate drive circuit 10, shift register 100, first shift register 101, second shift register 102, third shift register 103, input circuit 110, first NAND gate 111, second NAND gate 112, first input transistor T11, second input transistor T12, third input transistor T13, fourth input transistor T14, fifth input transistor T15, sixth input transistor T16, seventh input transistor T17, eighth input transistor T18, intermediate circuit 120, inverter circuit 121, first inverter 1211, second inverter 1212, control circuit 122, control transistor 1221, transmission gate 1222, first intermediate transistor T21, second intermediate transistor T22, third intermediate transistor T23, fourth intermediate transistor T24, fifth intermediate transistor T25, sixth intermediate transistor T26, output circuit 130, first output sub-circuit 131, third inverter 1311, fourth inverter 1312, second output sub-circuit 132, fifth inverter 1321, sixth inverter 1322, seventh inverter 1323, first output transistor T31, second output transistor T32, third output transistor T33, fourth output transistor T34, fifth output transistor T35, sixth output transistor T36, seventh output transistor T37, eighth output transistor T38, ninth output transistor T39, tenth output transistor T310, first output node N4, second output node N5, third output node N6, fourth output node N7, fifth output node N8, first power supply terminal VGH, second power supply terminal VGL, input voltage terminal STV, first clock signal terminal CKV1, second clock signal terminal CKV2, intermediate input signal V1, output signal V2 of the first NAND gate, first node N1, second node N2, third node N3, first output signal GP_out, second output signal GN_out, first clock signal line CK1, second clock signal line CK2, third clock signal line CK3, first clock signal terminal CKV11 of the first shift register, second clock signal terminal CKV12 of the first shift register, first clock signal terminal CKV21 of the second shift register, second clock signal terminal CKV22 of the second shift register, first clock signal terminal CKV31 of the third shift register, second clock signal terminal CKV32 of the third shift register, pixel circuit 20, storage capacitor Cst, first transistor T1, second transistor T2, third transistor T3, fourth transistor T4, fifth transistor T5, sixth transistor T6, seventh transistor T7, light-emitting element L1, first gate line Gate, second gate line Gaten, reset control line Resetn, first data line Data, initial power line Vinit, light emission control line EM, first power line VDD, second power line VSS.

DETAILED DESCRIPTION OF THE INVENTION

The embodiments of the present disclosure are described in detail below, and the examples of the embodiments are illustrated in the accompanying drawings, in which the same or similar reference numerals refer to the same or similar elements or elements having the same or similar functions. The embodiments described below with reference to the accompanying drawings are exemplary, and are only used to explain the present disclosure and should not be construed as limiting the present disclosure.

In the description of the present disclosure, it should be understood that the terms "first" and "second" are used for descriptive purposes only and cannot be understood as indicating or implying relative importance or implicitly indicating the number of technical features. Thus, the feature defined by "first" or "second" may explicitly or implicitly include one or more of the described features. In the description of the present disclosure, "a plurality of" refers to two or more, unless specifically defined otherwise.

Hereinafter, many different embodiments or examples are provided to implement different structures of the present disclosure. In order to simplify the present disclosure, components and arrangements in specific examples are described hereinafter, which are merely examples and are not intended to limit the present disclosure. In addition, the reference numerals and/or letters may be repeated in different examples of the present disclosure, and such repetition aims at simplicity and clarity, but does not indicate a relationship between the various embodiments and/or arrangements discussed. Furthermore, the present disclosure provides examples of various specific processes and materials, but one of ordinary skill in the art may appreciate that other processes and/or other materials may also be used.

In some practices, a low temperature polycrystalline oxide (LTPO) process is adopted to replace thin film transistors sensitive to gate leakage of a driving transistor in a pixel circuit with oxide thin film transistors, and other transistors still adopt low temperature poly-silicon (LTPS) thin film transistors, so as to reduce the leakage current of the pixel circuit and alleviate the flicker phenomenon of the pixel circuit under the low-frequency driving. However, in the foregoing solution, a positive-phase gate driving signal and a negative-phase gate driving signal, i.e., signals having opposite potentials, are required at the same time, and the existing gate drive circuit cannot conveniently provide two signals having opposite potentials simultaneously.

Figure 2:
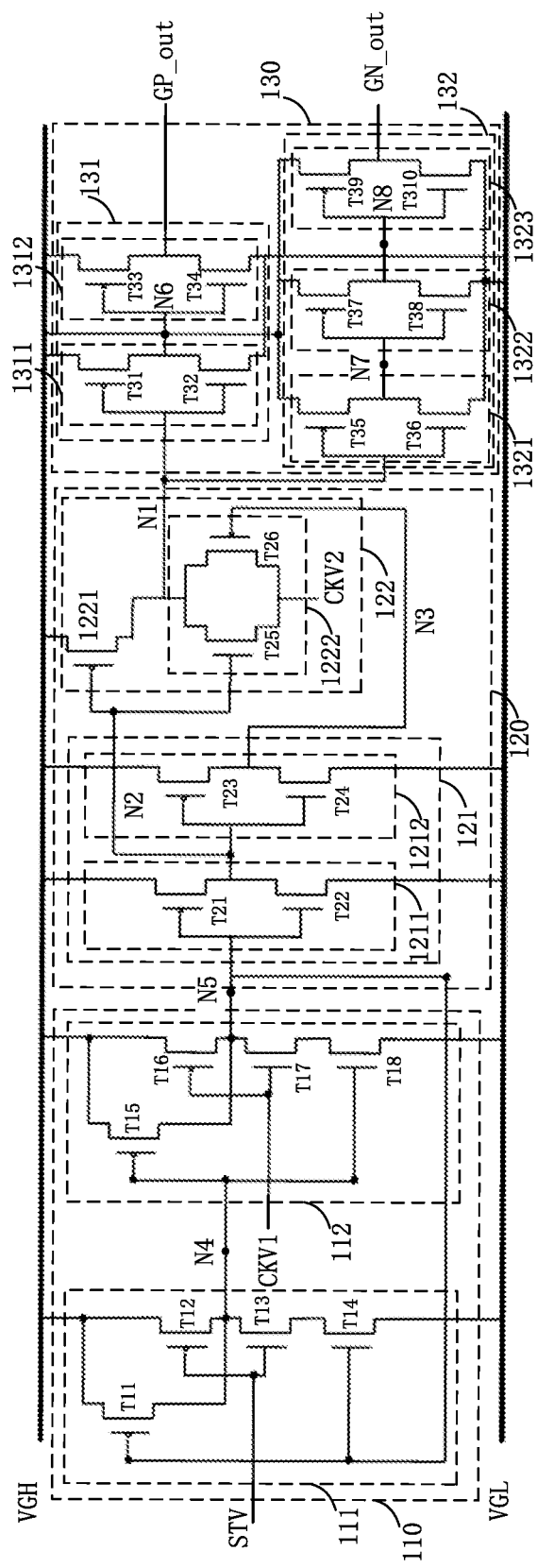
FIG. 2 is a circuit diagram of a shift register according to some embodiments of the present disclosure.

Referring to FIG. 1 and FIG. 2, the shift register 100 includes an input circuit 110, an intermediate circuit 120, and an output circuit 130.

The input circuit 110 is connected to a first power supply terminal VGH, a second power supply terminal VGL, an input voltage terminal STV and a first clock signal terminal CKV1. The input circuit 110 is configured to output an intermediate input signal V1 to the intermediate circuit 120 based on an input voltage signal provided by the input voltage terminal STV and a first clock signal provided by the first clock signal terminal CKV1.

The intermediate circuit 120 is connected to the first power supply terminal VGH, the second power supply terminal VGL and a second clock signal terminal CKV2. The intermediate circuit 120 is configured to output a first node signal to the output circuit 130 based on a second clock signal provided by the second clock signal terminal CKV2 and the intermediate input signal V1.

The output circuit 130 is connected to the first power supply terminal VGH, the second power supply terminal VGL, a first output terminal and a second output terminal. The output circuit 130 is configured to output a first output signal GP_out and a second output signal GN_out based on the first node signal. A potential of the first output signal GP_out and a potential of the second output signal GN_out are opposite.

In the embodiments of the present disclosure, in the shift register 100, based on the intermediate input signal V1 provided by the input circuit 110 and the first node signal provided by the intermediate circuit 120, the output circuit 130 outputs the first output signal GP_out and the second output signal GN_out. In this way, the first output signal GP_out and the second output signal GN_out having opposite potentials can be provided at the same time without occupying excessive layout space. That is, when the first output signal GP_out is at a low level, the second output signal GN_out is at a high level; and when the first output signal GP_out is at a high level, the second output signal GN_out is at a low level. In addition, the first output signal GP_out and the second output signal GN_out can be prevented from being affected by the delay of clock signals, and thus the first output signal GP_out and the second output signal GN_out are more stable.

It can be understood that the voltage signal provided by the first power supply terminal VGH is at the high level, and the voltage signal provided by the second power supply terminal VGL is at the low level. The voltage signals provided by the input voltage terminal STV, the first clock signal terminal CKV1 and the second clock signal terminal CKV2 may be at the high level or the low level. The low level and the high level are relative to each other, and a potential of the low level signal is lower than a potential of the high level signal. In different embodiments, the high level signals have different values, and the low level signals also have different values.

In some embodiments, the input circuit 110 includes a first NAND gate 111 and a second NAND gate 112.

A first input terminal of the first NAND gate 111 is connected to the input voltage terminal STV, and a second input terminal of the first NAND gate 111 is connected to an output terminal of the second NAND gate 112.

A first input terminal of the second NAND gate 112 is connected to an output terminal of the first NAND gate 111, a second input terminal of the second NAND gate 112 is connected to the first clock signal terminal CKV1, and the output terminal of the second NAND gate 112 is connected to an output terminal of the input circuit 110.

Specifically, for the first NAND gate 111, in the case that the input voltage signal provided by the input voltage terminal STV is at the low level, and the intermediate input signal V1 provided by the output terminal of the second NAND gate 112, i.e., the output terminal of the input circuit 110, is at the low level, that is, STV=0, V1=0, in the first NAND gate 111, a P-type transistor having a gate connected to the input voltage terminal STV is turned on, an N-type transistor having a gate connected to the input voltage terminal STV is turned off, a P-type transistor having a gate connected to the output terminal of the input circuit 110 is turned on, and an N-type transistor having a gate connected to the output terminal of the input circuit 110 is turned off. Therefore, the voltage signal from the first power supply terminal VGH can be transmitted to the output terminal of the first NAND gate 111, such that the output signal V2 of the first NAND gate 111 is at the high level, that is, V2=1.

Similarly, in the case that STV=0 and V1=1, V2=1.

In the case that STV=1 and V1=0, V2=1.

In the case that STV=1 and V1=1, V2=0.

For the second NAND gate 112, in the case that V2=0 and CKV1=0, V1=1.

In the case that V2=0 and CKV1=1, V1=1.

In the case that V2=1 and CKV1=0, V1=1.

In the case that V2=1 and CKV1=1, V1=0.

In this way, the input circuit 110 outputs the intermediate input signal V1 through the two short-circuited NAND gate circuits, and the output circuit 130 outputs the first output signal GP_out and the second output signal GN_out based on the intermediate input signal V1 provided by the input circuit 110 and the first node signal provided by the intermediate circuit 120. Thus, the first output signal GP_out and the second output signal GN_out having opposite potentials can be provided at the same time without occupying excessive layout space. In addition, the first output signal GP_out and the second output signal GN_out can be prevented from being affected by the delay of the clock signals, and thus the first output signal GP_out and the second output signal GN_out are more stable.

In some embodiments, the intermediate circuit 120 includes an inverter circuit 121 and a control circuit 122.

The inverter circuit 121 is connected to the first power supply terminal VGH and the second power supply terminal VGL. The inverter circuit 121 is configured to output a second node signal and a third node signal to the control circuit 122 based on the intermediate input signal V1. The potential of the second node signal and the potential of the third node signal are opposite.

The control circuit 122 is connected to the second clock signal terminal, the first power supply terminal VGH and the second power supply terminal VGL. The control circuit 122 is configured to output the first node signal to the output circuit 130 based on the second clock signal provided by the second clock signal terminal, the second node signal and the third node signal.

In some embodiments, the inverter circuit 121 includes a first inverter 1211 and a second inverter 1212.

An input terminal of the first inverter 1211 is connected to the output terminal of the input circuit 110, and the first inverter 1211 is configured to output the second node signal based on the intermediate input signal V1.

An input terminal of the second inverter 1212 is connected to an output terminal of the first inverter 1211, an output terminal of the second inverter 1212 is connected to the output terminal of the inverter circuit 121, and the second inverter 1212 is configured to output the third node signal based on the second node signal.

In some embodiments, the control circuit 122 includes a control transistor 1221 and a transmission gate 1222.

A gate of the control transistor 1221 is connected to the output terminal of the first inverter 1211, a first electrode of the control transistor 1221 is connected to the first power supply terminal VGH, and a second electrode of the control transistor 1221 is connected to an output terminal of the intermediate circuit 120.

An input terminal of the transmission gate 1222 is connected to the second clock signal terminal, a first control terminal of the transmission gate 1222 is connected to a second node N2, a second control terminal of the transmission gate 1222 is connected to a third node N3, and an output terminal of the transmission gate 1222 is connected to the output terminal of the intermediate circuit 120.

Specifically, for the first inverter 1211, in the case that the intermediate input signal V1 is at the high level, that is, V1=1, the P-type transistor in the first inverter 1211 is turned off, and the N-type transistor in the first inverter 1211 is turned on. Therefore, the voltage signal from the second power supply terminal VGL is transmitted to the second node N2, such that the second node signal output by the first inverter 1211 is at the low level, that is, N2=0.

Similarly, in the case that V1=0, N2=1.

For the second inverter 1212, in the case that N2=1, N3=0.

In the case that N2=0, N3=1.

In this way, the inverter circuit 121 outputs the third node signal through two inverters connected in series, and outputs the first node signal to the output circuit 130 through the control circuit 122, and the output circuit 130 outputs the first output signal GP_out and the second output signal GN_out. Thus, the first output signal GP_out and the second output signal GN_out having opposite potentials can be provided at the same time without occupying excessive layout space. In addition, the first output signal GP_out and the second output signal GN_out can be prevented from being affected by the delay of the clock signals, and thus the first output signal GP_out and the second output signal GN_out are more stable.

Furthermore, for the control circuit 122, the control transistor 1221 is a P-type transistor. In the case that the second node signal output by the first inverter 1211 is at the high level, and the second clock signal provided by the second clock signal terminal CKV2 is at the low level, that is, N2=1 and CKV2=0, since N2=1, the control transistor 1221 is turned off, the transistor at the first control terminal of the transmission gate 1222 is turned on, and N3=0. That is, the signal received by the second control terminal of the transmission gate 1222 is at the low level, and thus the transistor at the second control terminal of the transmission gate 1222 is turned on. Since the control transistor 1221 is turned off, the voltage signal from the first power supply terminal VGH cannot be transmitted to the first node N1. While, since the transistors at the first control terminal and at the second control terminal of the transmission gate 1222 are both turned on, the second clock signal provided by the second clock signal terminal CKV2 is transmitted to the first node N1. Since CKV2=0, N1=0, that is, the first node signal is at the low level.

Similarly, in the case that N2=0 and CKV2=1, N1=1.

In the case that N2=1 and CKV2=0, N1=1.

In the case that N2=1 and CKV2=1, N1=1.

In this way, the output of the first node signal is implemented through the inverter circuit 121 and the control circuit 122, and the output circuit 130 outputs the first output signal GP_out and the second output signal GN_out based on the first node signal. Thus, the first output signal GP_out and the second output signal GN_out having opposite potentials can be provided at the same time without occupying excessive layout space. In addition, the first output signal GP_out and the second output signal GN_out can be prevented from being affected by the delay of the clock signals, and thus the first output signal GP_out and the second output signal GN_out are more stable.

In some other embodiments, the control transistor 1221 is an N-type transistor. When the control transistor 1221 is an N-type transistor, the gate of the control transistor 1221 is connected to the output terminal of the second inverter 1212, the first electrode of the control transistor 1221 is connected to the first power supply terminal VGH, and the second electrode of the control transistor 1221 is connected to the output terminal of the intermediate circuit 120. The input terminal of the transmission gate 1222 is connected to the second clock signal terminal CKV2, the first control terminal of the transmission gate 1222 is connected to the second node N2, the second control terminal of the transmission gate 1222 is connected to the third node N3, and the output terminal of the transmission gate 1222 is connected to the output terminal of the intermediate circuit 120.

In some embodiments, the output circuit 130 includes a first output sub-circuit 131 connected to the first power supply terminal VGH and the second power supply terminal VGL, and the first output sub-circuit 131 includes a third inverter 1311 and a fourth inverter 1312.

An input terminal of the third inverter 1311 is connected to the first node N1, an output terminal of the third inverter 1311 is connected to an input terminal of the fourth inverter 1312, and an output terminal of the fourth inverter 1312 is connected to the first output terminal.

Specifically, for the third inverter 1311, in the case that the first node signal is at the high level, that is, N1=1, the P-type transistor in the third inverter 1311 is turned off, and the N-type transistor in the third inverter 1311 is turned on. Therefore, the voltage signal from the second power supply terminal VGL is transmitted to the output terminal of the third inverter 1311, such that the output signal of the third inverter 1311 is at the low level.

Similarly, in the case that N1=0, the output signal of the third inverter 1311 is at the high level.

For the fourth inverter 1312, in the case that the output signal of the third inverter 1311 is at the high level, the output signal of the fourth inverter 1312, i.e., the first output signal GP_out, is at the low level, that is, GP_out=0.

In the case that the output signal of the third inverter 1311 is at the low level, GP_out=1.

In summary, for the first output sub-circuit 131, in the case that N1=1, GP_out=1.

In the case that N1=0, GP_out=0.

In this way, by using the voltage signal from the first power supply terminal VGH or the second power supply terminal VGL as the first output signal GP_out, the first output signal GP_out is prevented from being affected by the delay of the clock signal, and the first output signal GP_out is more stable.

In some embodiments, the output circuit 130 further includes a second output sub-circuit 132 connected to the first power supply terminal VGH and the second power supply terminal VGL, and the second output sub-circuit 132 includes a fifth inverter 1321, a sixth inverter 1322 and a seventh inverter 1323. An input terminal of the fifth inverter 1321 is connected to the first node N1, an output terminal of the fifth inverter 1321 is connected to an input terminal of the sixth inverter 1322, an output terminal of the sixth inverter 1322 is connected to an input terminal of the seventh inverter 1323, and an output terminal of the seventh inverter 1323 is connected to the second output terminal.

Specifically, for the fifth inverter 1321, in the case that the first node signal is at the high level, that is, N1=1, the P-type transistor in the fifth inverter 1321 is turned off, and the N-type transistor in the fifth inverter 1321 is turned on. Therefore, the voltage signal from the second power supply terminal VGL is transmitted to the output terminal of the fifth inverter 1321, such that the output signal of the fifth inverter 1321 is at the low level.

Similarly, in the case that N1=0, the output signal of the fifth inverter 1321 is at the high level.

For the sixth inverter 1322, in the case that the output signal of the fifth inverter 1321 is at the high level, the output signal of the sixth inverter 1322 is at the low level.

In the case that the output signal of the fifth inverter 1321 is at the low level, the output signal of the sixth inverter 1322 is at the high level.

For the seventh inverter 1323, in the case that the output signal of the sixth inverter 1322 is at the high level, the output signal of the seventh inverter 1323, i.e., the second output signal GN_out, is the low level, that is, GN_out=0.

In the case that the output signal of the sixth inverter 1322 is at the low level, GN_out=1.

In summary, for the second output sub-circuit 132, in the case that N1=1, GN_out=0.

In the case that N1=0, GN_out=1.

In this way, by using the voltage signal from the first power supply terminal VGH or the second power supply terminal VGL as the second output signal GN_out, the second output signal GN_out is prevented from being affected by the delay of the clock signal, and the second output signal GN_out is more stable.

It should be noted that by providing three inverters in the second output sub-circuit 132, the ratio of a width to a length of a channel in each stage of transistor in the inverter can be effectively reduced, thereby further ensuring the stability of the output signals.

In some embodiments, the input circuit 110 includes a first input transistor T11, a second input transistor T12, a third input transistor T13, a fourth input transistor T14, a fifth input transistor T15, a sixth input transistor T16, a seventh input transistor T17, and an eighth input transistor T18. The first input transistor T11 is a P-type transistor. A first electrode of the first input transistor T11 is connected to the first power supply terminal VGH, a second electrode of the first input transistor T11 is connected to a first output node N4, and a gate of the first input transistor T11 is connected to a second output node N5. The second input transistor T12 is a P-type transistor. A first electrode of the second input transistor T12 is connected to the first power supply terminal VGH, a second electrode of the second input transistor T12 is connected to the first output node N4, and a gate of the second input transistor T12 is connected to the input voltage terminal STV. The third input transistor T13 is an N-type transistor. A first electrode of the third input transistor T13 is connected to the first output node N4, a second electrode of the third input transistor T13 is connected to a first electrode of the fourth input transistor T14, and a gate of the third input transistor T13 is connected to the input voltage terminal STV. The fourth input transistor T14 is an N-type transistor. A second electrode of the fourth input transistor T14 is connected to the second power supply terminal VGL, and a gate of the fourth input transistor T14 is connected to the second output node N5. The fifth input transistor T15 is a P-type transistor. A first electrode of the fifth input transistor T15 is connected to the first power supply terminal VGH, a second electrode of the fifth input transistor T15 is connected to the second output node N5, and a gate of the fifth input transistor T15 is connected to the first output node N4. The sixth input transistor T16 is a P-type transistor. A first electrode of the sixth input transistor T16 is connected to the first power supply terminal VGH, a second electrode of the sixth input transistor T16 is connected to the second output node N5, and a gate of the sixth input transistor T16 is connected to the first clock signal terminal CKV1. The seventh input transistor T17 is an N-type transistor. A first electrode of the seventh input transistor T17 is connected to the second output node N5, a second electrode of the seventh input transistor T17 is connected to a first electrode of the eighth input transistor T18, and a gate of the seventh input transistor T17 is connected to the first clock signal terminal CKV1. The eighth input transistor T18 is an N-type transistor. A second electrode of the eighth input transistor T18 is connected to the second power supply terminal VGL, and a gate of the eighth input transistor T18 is connected to the first output node N4.

The intermediate circuit 120 includes a first intermediate transistor T21, a second intermediate transistor T22, a third intermediate transistor T23, a fourth intermediate transistor T24, a control transistor 1221, a fifth intermediate transistor T25, and a sixth intermediate transistor T26. The first intermediate transistor T21 is a P-type transistor. A first electrode of the first intermediate transistor T21 is connected to the first power supply terminal VGH, a second electrode of the first intermediate transistor T21 is connected to the second node N2, and a gate of the first intermediate transistor T21 is connected to the second output node N5. The second intermediate transistor T22 is an N-type transistor. A first electrode of the second intermediate transistor T22 is connected to the second node N2, a second electrode of the second intermediate transistor T22 is connected to the second power supply terminal VGL, and a gate of the second intermediate transistor T22 is connected to the second output node N5. The third intermediate transistor T23 is a P-type transistor. A first electrode of the third intermediate transistor T23 is connected to the first power supply terminal VGH, a second electrode of the third intermediate transistor T23 is connected to a third node N3, and a gate of the third intermediate transistor T23 is connected to the second node N2. The fourth intermediate transistor T24 is an N-type transistor. A first electrode of the fourth intermediate transistor T24 is connected to the third node N3, a second electrode of the fourth intermediate transistor T24 is connected to the second power supply terminal VGL, and a gate of the fourth intermediate transistor T24 is connected to the second node N2. The control transistor 1221 is a P-type transistor. A first electrode of the control transistor 1221 is connected to the first power supply terminal VGH, a second electrode of the control transistor 1221 is connected to the first node N1, and a gate of the control transistor 1221 is connected to the second node N2. The fifth intermediate transistor T25 is an N-type transistor. A first electrode of the fifth intermediate transistor T25 is connected to the first node N1, a second electrode of the fifth intermediate transistor T25 is connected to the second clock signal terminal CKV2, and a gate of the fifth intermediate transistor T25 is connected to the second node N2. The sixth intermediate transistor T26 is a P-type transistor. A first electrode of the sixth intermediate transistor T26 is connected to the first node N1, a second electrode of the sixth intermediate transistor T26 is connected to the second clock signal terminal CKV2, and a gate of the sixth intermediate transistor T26 is connected to the third node N3.

The output circuit 130 includes a first output transistor T31, a second output transistor T32, a third output transistor T33, a fourth output transistor T34, a fifth output transistor T35, a sixth output transistor T36, a seventh output transistor T37, an eighth output transistor T38, a ninth output transistor T39, and a tenth output transistor T310. The first output transistor T31 is a P-type transistor. A first electrode of the first output transistor T31 is connected to the first power supply terminal VGH, a second electrode of the first output transistor T31 is connected to a third output node N6, and a gate of the first output transistor T31 is connected to the first node N1. The second output transistor T32 is an N-type transistor. A first electrode of the second output transistor T32 is connected to the third output node N6, a second electrode of the second output transistor T32 is connected to the second power supply terminal VGL, and a gate of the second output transistor T32 is connected to the first node N1. The third output transistor T33 is a P-type transistor. A first electrode of the third output transistor T33 is connected to the first power supply terminal VGH, a second electrode of the third output transistor T33 is connected to the first output terminal, and a gate of the third output transistor T33 is connected to the third output node N6. The fourth output transistor T34 is an N-type transistor. A first electrode of the fourth output transistor T34 is connected to the first output terminal, a second electrode of the fourth output transistor T34 is connected to the second power supply terminal VGL, and a gate of the fourth output transistor T34 is connected to the third output node N6. The fifth output transistor T35 is a P-type transistor. A first electrode of the fifth output transistor T35 is connected to the first power supply terminal VGH, a second electrode of the fifth output transistor T35 is connected to a fourth output node N7, and a gate of the fifth output transistor T35 is connected to the first node N1. The sixth output transistor T36 is an N-type transistor. A first electrode of the sixth output transistor T36 is connected to the fourth output node N7, a second electrode of the sixth output transistor T36 is connected to the second power supply terminal VGL, and a gate of the sixth output transistor T36 is connected to the first node N1. The seventh output transistor T37 is a P-type transistor. A first electrode of the seventh output transistor T37 is connected to the first power supply terminal VGH, a second electrode of the seventh output transistor T37 is connected to a fifth output node N8, and a gate of the seventh output transistor T37 is connected to the fourth output node N7. The eighth output transistor T38 is an N-type transistor. A first electrode of the eighth output transistor T38 is connected to the fifth output node N8, a second electrode of the eighth output transistor T38 is connected to the second power supply terminal VGL, and a gate of the eighth output transistor T38 is connected to the fourth output node N7. The ninth output transistor T39 is a P-type transistor. A first electrode of the ninth output transistor T39 is connected to the first power supply terminal VGH, a second electrode of the ninth output transistor T39 is connected to the second output terminal, and a gate of the ninth output transistor T39 is connected to the fifth output node N8. The tenth output transistor T310 is an N-type transistor. A first electrode of the tenth output transistor T310 is connected to the second output terminal, a second electrode of the tenth output transistor T310 is connected to the second power supply terminal VGL, and a gate of the tenth output transistor T310 is connected to the fifth output node N8.

In this way, based on the intermediate input signal V1 provided by the input circuit 110 and the first node signal provided by the intermediate circuit 120, the output circuit 130 outputs the first output signal GP_out and the second output signal GN_out. Thus, the first output signal GP_out and the second output signal GN_out having opposite potentials can be provided at the same time without occupying excessive layout space. That is, when the first output signal GP_out is at the low level, the second output signal GN_out is at the high level; and when the first output signal GP_out is at the high level, the second output signal GN_out is at the low level. In addition, the first output signal GP_out and the second output signal GN_out can be prevented from being affected by the delay of clock signals, and thus the first output signal GP_out and the second output signal GN_out are more stable.

Figure 3:
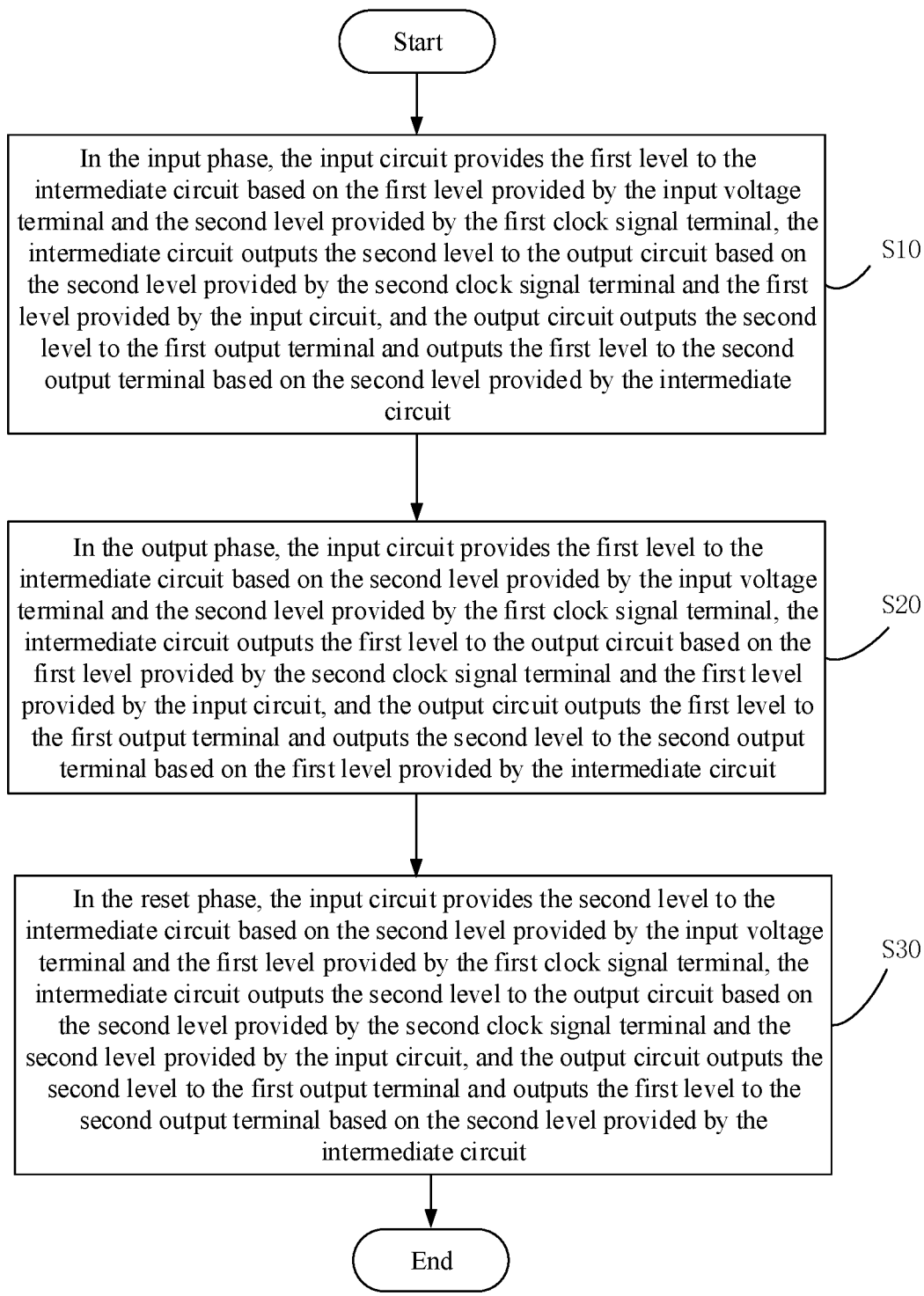
FIG. 3 is a flowchart of a method for controlling a shift register according to some embodiments of the present disclosure.
Figure 4:
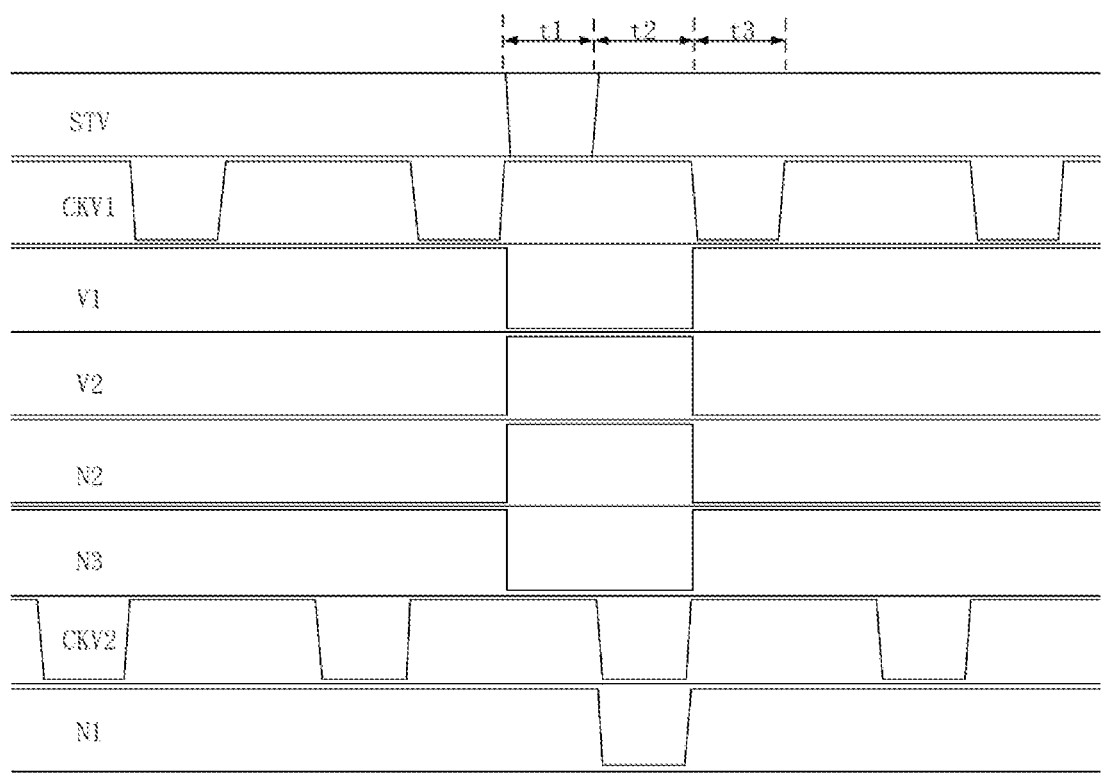
FIG. 4 is a signal timing diagram of a shift register according to some embodiments of the present disclosure.

Referring to FIG. 3 and FIG. 4, a method for controlling a shift register 100 according to the embodiments of the present disclosure is applicable to the shift register 100 described above. The display cycle includes an input phase t1, an output phase t2, and a reset phase t3 sequentially, and the method for controlling the shift register includes the followings.

In S10, in the input phase t1, the input circuit 110 provides the first level to the intermediate circuit 120 based on the first level provided by the input voltage terminal STV and the second level provided by the first clock signal terminal CKV1, the intermediate circuit 120 outputs the second level to the output circuit 130 based on the second level provided by the second clock signal terminal CKV2 and the first level provided by the input circuit 110, and the output circuit 130 outputs the second level to the first output terminal and outputs the first level to the second output terminal based on the second level provided by the intermediate circuit 120.

In S20, in the output phase t2, the input circuit 110 provides the first level to the intermediate circuit 120 based on the second level provided by the input voltage terminal STV and the second level provided by the first clock signal terminal CKV1, the intermediate circuit 120 outputs the first level to the output circuit 130 based on the first level provided by the second clock signal terminal CKV2 and the first level provided by the input circuit 110, and the output circuit 130 outputs the first level to the first output terminal and outputs the second level to the second output terminal based on the first level provided by the intermediate circuit 120.

In S30, in the reset phase t3, the input circuit 110 provides the second level to the intermediate circuit 120 based on the second level provided by the input voltage terminal STV and the first level provided by the first clock signal terminal CKV1, the intermediate circuit 120 outputs the second level to the output circuit 130 based on the second level provided by the second clock signal terminal CKV2 and the second level provided by the input circuit 110, and the output circuit 130 outputs the second level to the first output terminal and outputs the first level to the second output terminal based on the second level provided by the intermediate circuit 120.

Specifically, the first level is a low level, and the second level is a high level.

Referring to FIG. 1, FIG. 2 and FIG. 4, in the input phase t1, the input voltage terminal STV provides the first level to the first NAND gate 111, and the first clock signal terminal CKV1 provides the second level to the second NAND gate 112, such that the intermediate input signal V1 is at the first level.

The input circuit 110 provides the first level to the first inverter 1211, such that the second node signal is at the second level, and the third node signal is at the first level. The second clock signal terminal CKV2 provides the second level to the input terminal of the transmission gate 1222, and the control circuit 122 outputs the first node signal based on the second node signal, the third node signal and the second clock signal. At this time, the first node signal is at the second level.

The output circuit 130 outputs the first output signal GP_out and the second output signal GN_out based on the second level provided by the intermediate circuit 120. At this time, the first output signal GP_out is at the second level, and the second output signal GN_out is at the first level.

In the output phase t2, the input voltage terminal STV provides the second level to the first NAND gate 111, and the first clock signal terminal CKV1 provides the second level to the second NAND gate 112, such that the intermediate input signal V1 is at the first level.

The input circuit 110 provides the first level to the first inverter 1211, such that the second node signal is at the second level, and the third node signal is at the first level. The second clock signal terminal CKV2 provides the first level to the input terminal of the transmission gate 1222, and the control circuit 122 outputs the first node signal based on the second node signal, the third node signal and the second clock signal. At this time, the first node signal is at the first level.

The output circuit 130 outputs the first output signal GP_out and the second output signal GN_out based on the first level provided by the intermediate circuit 120. At this time, the first output signal GP_out is at the first level, and the second output signal GN_out is at the second level.

In the reset phase t3, the input voltage terminal STV provides the second level to the first NAND gate 111, and the first clock signal terminal CKV1 provides the first level to the second NAND gate 112, such that the intermediate input signal V1 is at the second level.

The input circuit 110 provides the second level to the first inverter 1211, such that the second node signal is at the first level, and the third node signal is at the second level. The second clock signal terminal CKV2 provides the second level to the input terminal of the transmission gate 1222, and the control circuit 122 outputs the first node signal based on the second node signal, the third node signal and the second clock signal. At this time, the first node signal is at the second level.

The output circuit 130 outputs the first output signal GP_out and the second output signal GN_out based on the second level provided by the intermediate circuit 120. At this time, the first output signal GP_out is at the second level, and the second output signal GN_out is at the first level.

In this way, the shift output of the first node signal is achieved. In addition, the first output signal GP_out and the second output signal GN_out are output by the output circuit 130, such that the shift register 100 can provide the first output signal GP_out and the second output signal GN_out having opposite potentials at the same time without occupying excessive layout space, and the first output signal GP_out and the second output signal GN_out can be prevented from being affected by the delay of the clock signals. Therefore, the first output signal GP_out and the second output signal GN_out are more stable.

The gate drive circuit 10 in the embodiments of the present disclosure includes the shift register 100 described in any one of the above embodiments.

Figure 5:
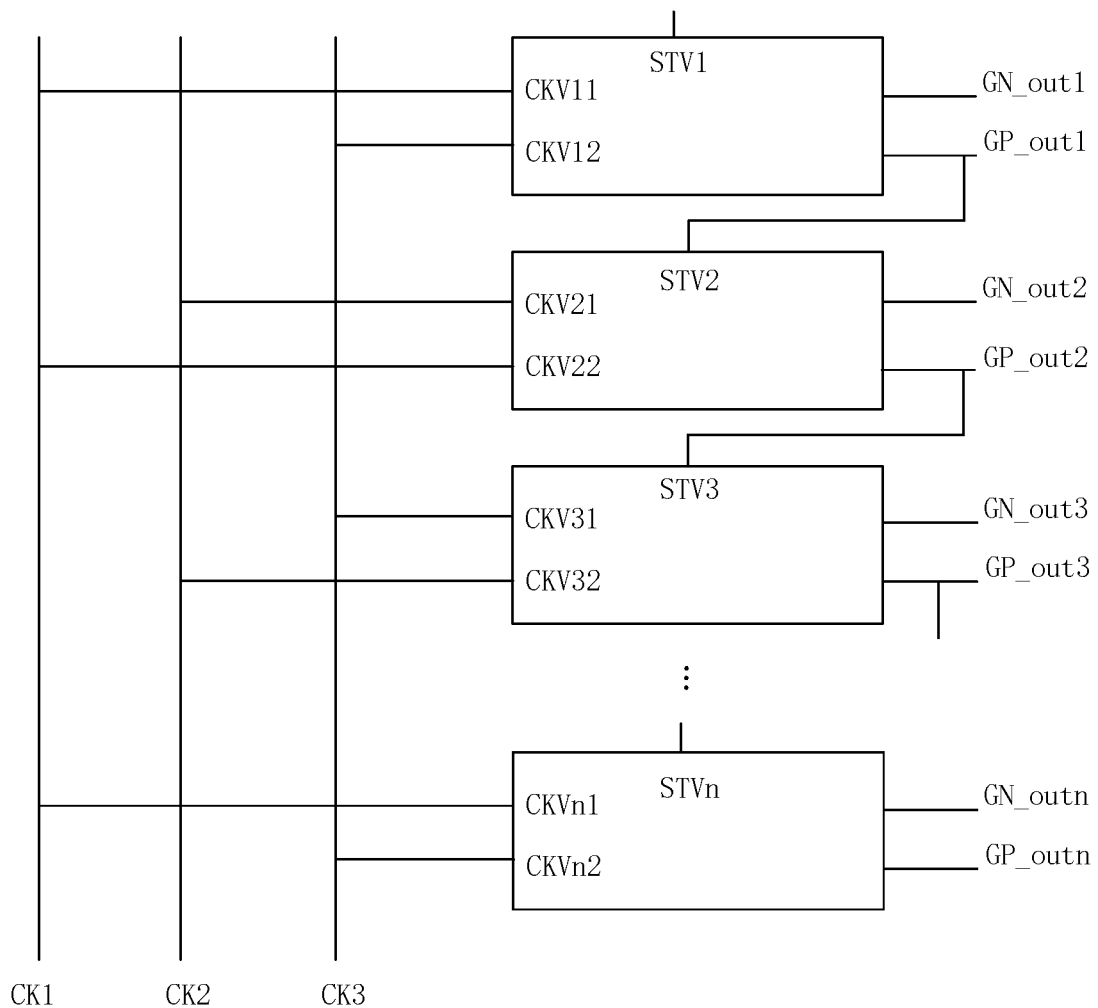
FIG. 5 is a schematic structural diagram of a gate drive circuit according to some embodiments of the present disclosure.

Referring to FIG. 5, in some embodiments, the gate drive circuit 10 includes a plurality of cascaded shift registers 100. Except the first stage of shift register, the input voltage terminal STV of a current stage of shift register is connected to the first output terminal of a previous stage of shift register.

Figure 6:
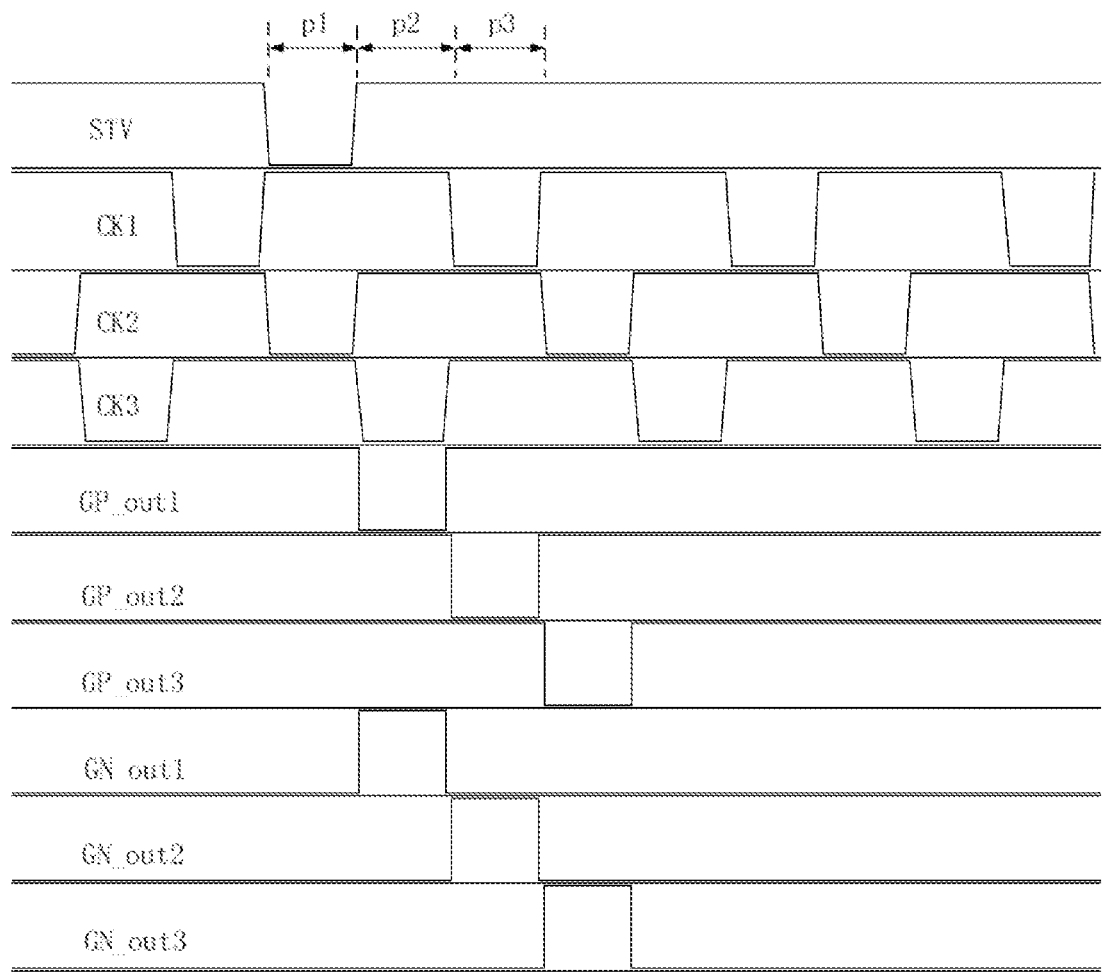
FIG. 6 is a signal timing diagram of a gate drive circuit according to some embodiments of the present disclosure.

Specifically, referring to FIG. 5 and FIG. 6, except the first stage of shift register, the input voltage terminal STV of a current stage of shift register is connected to the first output terminal of a previous stage of shift register. That is, in the p1 phase, the first stage of shift register receives an input voltage signal provided by the input voltage terminal STV, and in the p2 phase, the first stage of shift register outputs a first output signal GP_out1 and a second output signal GN_out1 of the first stage of shift register. Here, the first output signal GP_out1 serves as an input voltage signal of the second stage of shift register, such that the second stage of shift register outputs a first output signal GP_out2 and a second output signal GN_out2 of the second stage of shift register in the p3 phase. By analogy, the $n^{th}$ stage of shift register outputs a first output signal GP_outn and a second output signal GN_outn of the $n^{th}$ stage of shift register in the p(n+1) phase.

In this way, the shift output of the first node signal of each stage of shift register can be achieved, thereby achieving the progressive scanning of the gate lines.

Referring to FIG. 5 again, in some embodiments, the gate drive circuit 10 includes a first clock signal line CK1, a second clock signal line CK2, a third clock signal line CK3, and a first shift register 101, a second shift register 102, and a third shift register 103 which are cascaded in sequence. The first clock signal line CK1 is connected to a first clock signal terminal CKV11 of the first shift register 101, and the third clock signal line CK3 is connected to a second clock signal terminal CKV12 of the first shift register 101. The second clock signal line CK2 is connected to a first clock signal terminal CKV21 of the second shift register 102, and the first clock signal line CK1 is connected to a second clock signal terminal CKV22 of the second shift register 102. The third clock signal line CK3 is connected to a first clock signal terminal CKV31 of the third shift register 103, and the second clock signal line CK2 is connected to a second clock signal terminal CKV32 of the third shift register 103.

Figure 7:
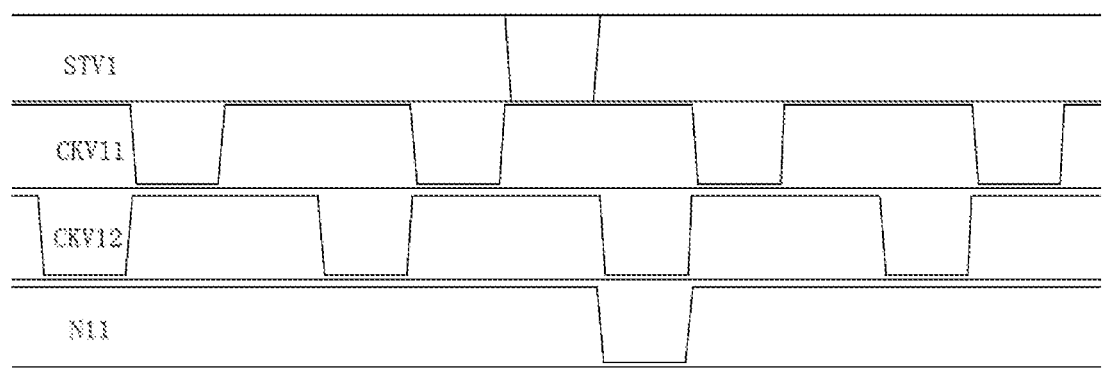
FIG. 7 is a signal timing diagram of a first shift register according to some embodiments of the present disclosure.

Specifically, referring to FIG. 6 and FIG. 7, the first clock signal terminal CKV11 of the first shift register 101 is connected to the first clock signal line CK1, and the second clock signal terminal CKV12 of the first shift register 101 is connected to the third clock signal line CK3. Therefore, the timing of CK1 and CK3 is obtained according to FIG. 6, and the first node signal of the first shift register 101 is obtained according to the foregoing descriptions of the embodiments of the shift register, thereby obtaining the first output signal GP_out1 and the second output signal GN_out1 of the first shift register 101. The first output signal GP_out1 and the second output signal GN_out1 have opposite potentials, that is, the second output signal GN_out is at the high level when the first output signal GP_out is at the low level, and the second output signal GN_out is at the low level when the first output signal GP_out is at the high level.

The timing of the second shift register 102 and the timing of the third shift register 103 are similar to the timing of the first shift register 101, which are not repeated here. For details, please refer to the foregoing descriptions of the embodiments of the shift register 100 and the timing of the first shift register 101.

In this way, based on the clock signal input by the connected clock signal line, each stage of shift register can generate the corresponding first output signal GP_outn and second output signal GN_outn in different phases, so as to achieve the shift output of the first node signal of each stage of shift register, thereby achieving the progressive scanning of the gate lines.

The display panel according to the embodiments of the present disclosure includes a pixel circuit 20 and the gate drive circuit 10 as described above. The pixel circuit 20 and the gate drive circuit 10 are connected to each other, such that the gate drive circuit 10 provides the first output signal GP_out and the second output signal GN_out to the pixel circuit 20.

Figure 8:
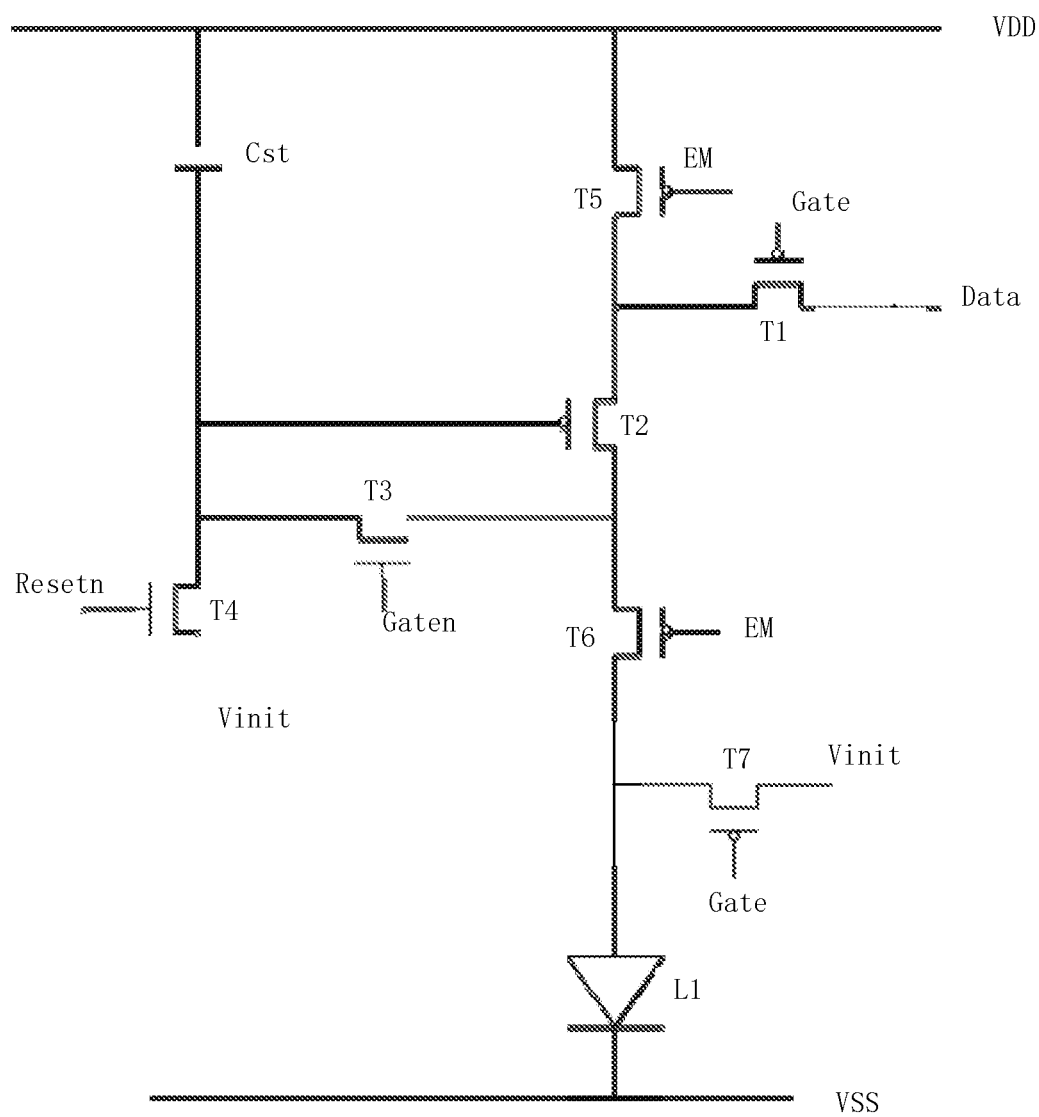
FIG. 8 is a circuit diagram of a pixel circuit according to some embodiments of the present disclosure.

Referring to FIG. 8, in some embodiments, the pixel circuit 20 includes a first transistor T1, a second transistor T2, a third transistor T3, and a storage capacitor Cst.

A first electrode of the first transistor T1 is connected to a first data line Data, a second electrode of the first transistor T1 is connected to a first electrode of the second transistor T2, and a gate of the first transistor T1 is connected to a first gate line Gate. The first gate line Gate is configured to receive the first output signal GP_out provided by the shift register 100.

One terminal of the storage capacitor Cst is connected to a first power line VDD, and the other terminal of the storage capacitor Cst is connected to a gate of the second transistor T2.

A first electrode of the third transistor T3 is connected to the gate of the second transistor T2, a second electrode of the third transistor T3 is connected to a second electrode of the second transistor T2, and a gate of the third transistor T3 is connected to a second gate line Gaten. The second gate line Gaten is configured to receive the second output signal GN_out provided by the shift register 100.

Specifically, in order to reduce the leakage current of the pixel circuit 20 and alleviate the flicker phenomenon of the pixel circuit 20 under the low-frequency driving, the LTPO process is adopted to replace the thin film transistors sensitive to the gate leakage of the driving transistor in the pixel circuit 20 with oxide thin film transistors, and the other transistors still adopt the LTPS transistors. That is, the first transistor T1 and the second transistor T2 are P-type transistors, and the third transistor T3 is a N-type transistor. In this way, the pixel circuit 20 can cooperate with the gate drive circuit 10, to receive the first output signal GP_out and the second output signal GN_out provided by the gate drive circuit 10, thereby improving the display effect of the display panel.

Furthermore, when the first transistor T1 and the second transistor T2 are P-type transistors and the third transistor T3 is an N-type transistor, the pixel circuit 20 receives the first output signal GP_outn and the second output signal GN_outn provided by the $n^{th}$ stage of shift register. When the first output signal GP_outn received by the first gate line Gate is at the low level, the second output signal GN_outn received by the second gate line Gaten is at the high level. At this time, the first electrode and the second electrode of the first transistor T1 are turned on, and the first data signal is written into the first electrode of the second transistor T2. In addition, based on the second output signal GN_outn, the first electrode and the second electrode of the third transistor T3 are turned on, such that the first electrode and the second electrode of the second transistor T2 are turned on, and the first data signal written by the first data line Data and a threshold voltage of the second transistor T2 are stored in the storage capacitor Cst.

In this way, the third transistor T3 is controlled to be turned on or turned off based on the second output signal GN_outn to compensate for the threshold voltage of the second transistor T2, and the first transistor T1 is controlled to be turned on or turned off based on the first output signal GP_outn. As such, the driving current of the second transistor T2 is irrelevant to the threshold voltage of the second transistor T2.

It should be noted that the transistors are thin film transistors, field-effect transistors, or other switching devices having the same characteristics. The source and the drain of the transistor used herein is symmetrical in structure, so there is no difference between the source and the drain in structure. In the embodiments of the present disclosure, in order to distinguish between the two electrodes, except the gate, of the transistor, one of the two electrodes is referred to as a first electrode, and the other electrode is referred to as a second electrode. Therefore, the source and the drain of all or part of the transistors in the embodiments of the present disclosure are interchangeable as needed.

In some embodiments, the pixel circuit 20 includes a fourth transistor T4. A first electrode of the fourth transistor T4 is connected to an initial power line Vinit, a second electrode of the fourth transistor T4 is connected to the gate of the second transistor T2, and a gate of the fourth transistor T4 is connected to a reset control line Resetn. The reset control line Resetn is configured to receive the second output signal GN_out provided by the shift register 100.

Specifically, the fourth transistor T4 is an N-type transistor, and the fourth transistor T4 adopts an LTPO transistor. The reset control line Resetn receives the second output signal GN_outn-1 provided by the $(n-1)^{th}$ stage of shift register. When the second output signal GN_outn-1 received by the reset control line Resetn is at the high level, the first electrode and the second electrode of the sixth transistor T6 are turned on, and an initial voltage signal transmitted by the initial power line Vinit is written into the gate of the second transistor T2, thereby resetting the gate voltage of the second transistor T2 to an initial voltage.

In this way, the gate of the second transistor T2 is reset before the first output signal GP_outn is at the low level and the second output signal GN_outn is at the high level, which ensures the stable display of the pixel circuit 20.

In some embodiments, the pixel circuit 20 includes a fifth transistor T5, a sixth transistor T6 and a light-emitting element L1.

A gate of the fifth transistor T5 is connected to a light emission control line EM, a first electrode of the fifth transistor T5 is connected to the first power line VDD, and a second electrode of the fifth transistor T5 is connected to the first electrode of the second transistor T2.

A gate of the sixth transistor T6 is connected to the light emission control line EM, a first electrode of the sixth transistor T6 is connected to the second electrode of the second transistor T2, a second electrode of the sixth transistor T6 is connected to one end of the light-emitting element L1, and the other end of the light-emitting element L1 is connected to a second power line VSS.

Specifically, the fifth transistor T5 and the sixth transistor T6 are P-type transistors. The gate of the fifth transistor T5 is connected to the light emission control line EM. When the light emission control line EM inputs a light emission control signal, the first electrode and the second electrode of the fifth transistor T5 are turned on, such that the light emission control signal is written into the first electrode of the second transistor T2. The gate of the sixth transistor T6 is connected to the light emission control line EM. When the light emission control line EM inputs the light emission control signal, the first electrode and the second electrode of the sixth transistor T6 are turned on, and the light emission control signal is written into the light-emitting element L1 when the second transistor T2 is turned on, such that the light-emitting element L1 emits light.

It is understood that the light-emitting element L1 is an element having a light-emitting function, such as an LED, an OLED, a Micro LED, or a Mini LED, which is not limited specifically.

In some embodiments, the pixel circuit 20 includes a seventh transistor T7. A first electrode of the seventh transistor T7 is connected to the initial power line Vinit, a second electrode of the seventh transistor T7 is connected to the second electrode of the sixth transistor T6, and a gate of the seventh transistor T7 is connected to the first gate line Gate. The first gate line Gate is configured to receive the first output signal GP_out provided by the shift register 100.

Specifically, the seventh transistor T7 is a P-type transistor. The first gate line Gate receives the first output signal GP_outn provided by the $n^{th}$ stage of shift register. When the first output signal GP_outn received by the first gate line Gate is at the low level, the first electrode and the second electrode of the seventh transistor T7 are turned on, and the initial voltage signal transmitted by the initial power line Vinit is written into the second electrode of the seventh transistor T7.

In some embodiments, the first transistor T1, the second transistor T2, the fifth transistor T5, the sixth transistor T6 and the seventh transistor T7 are P-type transistors, and the third transistor T3 and the fourth transistor T4 are N-type transistors.

Specifically, the first gate line Gate receives the first output signal GP_outn provided by the $n^{th}$ stage of shift register, the second gate line Gaten receives the second output signal GN_outn provided by the $n^{th}$ stage of shift register, and the reset control line Resetn receives the second output signal GN_outn-1 provided by the $(n-1)^{th}$ stage of shift register.

Before the first output signal GP_outn is at the low level and the second output signal GN_outn is at the high level, the second output signal GN_outn-1 provided by the $(n-1)^{th}$ stage of shift register and received by the reset control line Resetn is at the high level, the first electrode and the second electrode of the sixth transistor T6 are turned on, and the initial voltage signal transmitted by the initial power line Vinit is written into the gate of the second transistor T2, thereby resetting the gate voltage of the second transistor T2 to the initial voltage.

When the first output signal GP_outn is at the low level and the second output signal GN_outn is at the high level, the first electrode and the second electrode of the first transistor T1 are turned on because of the low level of the first output signal GP_outn, and the first data signal is written into the first electrode of the second transistor T2. The first electrode and the second electrode of the seventh transistor T7 are turned on, and the initial voltage signal transmitted by the initial power line Vinit is written into the second electrode of the seventh transistor T7. Meanwhile, based on the second output signal GN_outn, the first electrode and the second electrode of the third transistor T3 are turned on, such that the first electrode and the second electrode of the second transistor T2 are turned on, and the first data signal written by the first data line Data and the threshold voltage of the second transistor T2 are stored in the storage capacitor Cst.

Subsequently, when the light emission control line EM inputs the light emission control signal, the first electrode and the second electrode of the fifth transistor T5 are turned on, and the first electrode and the second electrode of the sixth transistor T6 are turned on, such that the light emission control signal is written into the light-emitting element L1 to control the light-emitting element L1 to emit light.

In this way, the pixel circuit 20 is controlled based on the first output signal GP_out and the second output signal GN_out having opposite potentials provided by the gate drive circuit 10.

In the descriptions of the present specification, the reference terms "one embodiment," "some embodiments," "an illustrative embodiment," "an example," "a specific example," "some examples," or the like intend to mean that a particular feature, structure, material or characteristic described in combination with the embodiment or example is included in at least one embodiment or example of the present disclosure. In the specification, the illustrative expression of the above terms does not necessarily refer to the same embodiment or example. Furthermore, the particular feature, structure, material, or characteristic described may be combined in a suitable manner in any one or more embodiments or examples.

Although the embodiments of the present disclosure have been illustrated and described, persons of ordinary skill in the art can understand that various changes, modifications, substitutions and variations may be made to these embodiments without departing from the principles and purposes of the present disclosure, and the scope of the present disclosure is defined by the claims and equivalents thereof.

What is claimed is:

1. A shift register, comprising: an input circuit, an intermediate circuit and an output circuit, the intermediate circuit being connected to the input circuit and the output circuit, wherein
the input circuit is connected to a first power supply terminal, a second power supply terminal, an input voltage terminal and a first clock signal terminal, and the input circuit is configured to output an intermediate input signal to the intermediate circuit based on an input voltage signal provided by the input voltage terminal and a first clock signal provided by the first clock signal terminal;
the intermediate circuit is connected to the first power supply terminal, the second power supply terminal and a second clock signal terminal, and the intermediate circuit is configured to output a first node signal to the output circuit based on a second clock signal provided by the second clock signal terminal and the intermediate input signal; and
the output circuit is connected to the first power supply terminal, the second power supply terminal, a first output terminal and a second output terminal, and the output circuit is configured to output a first output signal and a second output signal based on the first node signal, wherein a potential of the first output signal and a potential of the second output signal are opposite, wherein the input circuit comprises a first NAND gate and a second NAND gate, wherein
a first input terminal of the first NAND gate is connected to the input voltage terminal, and a second input terminal of the first NAND gate is connected to an output terminal of the second NAND gate; and
a first input terminal of the second NAND gate is connected to an output terminal of the first NAND gate, and a second input terminal of the second NAND gate is connected to the first clock signal terminal.

2. The shift register according to claim 1, wherein the intermediate circuit comprises an inverter circuit and a control circuit, wherein
the inverter circuit is connected to the first power supply terminal and the second power supply terminal, and the inverter circuit is configured to output a second node signal and a third node signal to the control circuit based on the intermediate input signal, wherein a potential of the second node signal and a potential of the third node signal are opposite; and
the control circuit is connected to the second clock signal terminal, the first power supply terminal and the second power supply terminal, and the control circuit is configured to output the first node signal to the output circuit based on the second clock signal provided by the second clock signal terminal, the second node signal and the third node signal.

3. The shift register according to claim 2, wherein the inverter circuit comprises a first inverter and a second inverter, wherein
an input terminal of the first inverter is connected to an output terminal of the input circuit, and the first inverter is configured to output the second node signal based on the intermediate input signal; and
an input terminal of the second inverter is connected to an output terminal of the first inverter, and the second inverter is configured to output the third node signal based on the second node signal.

4. The shift register according to claim 2, wherein the control circuit comprises a control transistor and a transmission gate, wherein
a gate of the control transistor is connected to the output terminal of the first inverter, a first electrode of the control transistor is connected to the first power supply terminal, and a second electrode of the control transistor is connected to an output terminal of the intermediate circuit; and
an input terminal of the transmission gate is connected to the second clock signal terminal, a first control terminal of the transmission gate is connected to a second node, a second control terminal of the transmission gate is connected to a third node, and an output terminal of the transmission gate is connected to the output terminal the intermediate circuit.

5. The shift register according to claim 1, wherein the output circuit comprises a first output sub-circuit connected to the first power supply terminal and the second power supply terminal, and the first output sub-circuit comprises a third inverter and a fourth inverter, wherein
an input terminal of the third inverter is connected to a first node, an output terminal of the third inverter is connected to an input terminal of the fourth inverter, and an output terminal of the fourth inverter is connected to the first output terminal.

6. The shift register according to claim 1, wherein the output circuit further comprises a second output sub-circuit connected to the first power supply terminal and the second power supply terminal, and the second output sub-circuit comprises a fifth inverter, a sixth inverter and a seventh inverter, wherein
an input terminal of the fifth inverter is connected to a first node, an output terminal of the fifth inverter is connected to an input terminal of the sixth inverter, an output terminal of the sixth inverter is connected to an input terminal of the seventh inverter, and an output terminal of the seventh inverter is connected to the second output terminal.

7. The shift register according to claim 1, wherein
the input circuit comprises a first input transistor, a second input transistor, a third input transistor, a fourth input transistor, a fifth input transistor, a sixth input transistor, a seventh input transistor and an eighth input transistor; wherein
the first input transistor is a P-type transistor, a first electrode of the first input transistor is connected to the first power supply terminal, a second electrode of the first input transistor is connected to a first output node, and a gate of the first input transistor is connected to a second output node;
the second input transistor is a P-type transistor, a first electrode of the second input transistor is connected to the first power supply terminal, a second electrode of the second input transistor is connected to the first output node, and a gate of the second input transistor is connected to the input voltage terminal;
the third input transistor is an N-type transistor, a first electrode of the third input transistor is connected to the first output node, a second electrode of the third input transistor is connected to a first electrode of the fourth input transistor, and a gate of the third input transistor is connected to the input voltage terminal;
the fourth input transistor is an N-type transistor, a second electrode of the fourth input transistor is connected to the second power supply terminal, and a gate of the fourth input transistor is connected to the second output node;
the fifth input transistor is a P-type transistor, a first electrode of the fifth input transistor is connected to the first power supply terminal, a second electrode of the fifth input transistor is connected to the second output node, and a gate of the fifth input transistor is connected to the first output node;
the sixth input transistor is a P-type transistor, a first electrode of the sixth input transistor is connected to the first power supply terminal, a second electrode of the sixth input transistor is connected to the second output node, and a gate of the sixth input transistor is connected to the first clock signal terminal;
the seventh input transistor is an N-type transistor, a first electrode of the seventh input transistor is connected to the second output node, a second electrode of the seventh input transistor is connected to a first electrode of the eighth input transistor, and a gate of the seventh input transistor is connected to the first clock signal terminal; and
the eighth input transistor is an N-type transistor, a second electrode of the eighth input transistor is connected to the second power supply terminal, and a gate of the eighth input transistor is connected to the first output node;
the intermediate circuit comprises a first intermediate transistor, a second intermediate transistor, a third intermediate transistor, a fourth intermediate transistor, a control transistor, a fifth intermediate transistor and a sixth intermediate transistor; wherein the first intermediate transistor is a P-type transistor, a first electrode of the first intermediate transistor is connected to the first power supply terminal, a second electrode of the first intermediate transistor is connected to a second node, and a gate of the first intermediate transistor is connected to the second output node;

the second intermediate transistor is an N-type transistor, a first electrode of the second intermediate transistor is connected to the second node, a second electrode of the second intermediate transistor is connected to the second power supply terminal, and a gate of the second intermediate transistor is connected to the second output node;

the third intermediate transistor is a P-type transistor, a first electrode of the third intermediate transistor is connected to the first power supply terminal, a second electrode of the third intermediate transistor is connected to a third node, and a gate of the third intermediate transistor is connected to the second node;

the fourth intermediate transistor is an N-type transistor, a first electrode of the fourth intermediate transistor is connected to the third node, a second electrode of the fourth intermediate transistor is connected to the second power supply terminal, and a gate of the fourth intermediate transistor is connected to the second node;

the control transistor is a P-type transistor, a first electrode of the control transistor is connected to the first power supply terminal, a second electrode of the control transistor is connected to a first node, and a gate of the control transistor is connected to the second node;

the fifth intermediate transistor is an N-type transistor, a first electrode of the fifth intermediate transistor is connected to the first node, a second electrode of the fifth intermediate transistor is connected to the second clock signal terminal, and a gate of the fifth intermediate transistor is connected to the second node; and the sixth intermediate transistor is a P-type transistor, a first electrode of the sixth intermediate transistor is connected to the first node, a second electrode of the sixth intermediate transistor is connected to the second clock signal terminal, and a gate of the sixth intermediate transistor is connected to the third node;

the output circuit comprises a first output transistor, a second output transistor, a third output transistor, a fourth output transistor, a fifth output transistor, a sixth output transistor, a seventh output transistor, an eighth output transistor, a ninth output transistor and a tenth output transistor; wherein the first output transistor is a P-type transistor, a first electrode of the first output transistor is connected to the first power supply terminal, a second electrode of the first output transistor is connected to a third output node, and a gate of the first output transistor is connected to the first node;

the second output transistor is an N-type transistor, a first electrode of the second output transistor is connected to the third output node, a second electrode of the second output transistor is connected to the second power supply terminal, and a gate of the second output transistor is connected to the first node;

the third output transistor is a P-type transistor, a first electrode of the third output transistor is connected to the first power supply terminal, a second electrode of the third output transistor is connected to the first output terminal, and a gate of the third output transistor is connected to the third output node;

the fourth output transistor is an N-type transistor, a first electrode of the fourth output transistor is connected to the first output terminal, a second electrode of the fourth output transistor is connected to the second power supply terminal, and a gate of the fourth output transistor is connected to the third output node;

the fifth output transistor is a P-type transistor, a first electrode of the fifth output transistor is connected to the first power supply terminal, a second electrode of the fifth output transistor is connected to a fourth output node, and a gate of the fifth output transistor is connected to the first node;

the sixth output transistor is an N-type transistor, a first electrode of the sixth output transistor is connected to the fourth output node, a second electrode of the sixth output transistor is connected to the second power supply terminal, and a gate of the sixth output transistor is connected to the first node;

the seventh output transistor is a P-type transistor, a first electrode of the seventh output transistor is connected to the first power supply terminal, a second electrode of the seventh output transistor is connected to a fifth output node, and a gate of the seventh output transistor is connected to the fourth output node;

the eighth output transistor is an N-type transistor, a first electrode of the eighth output transistor is connected to the fifth output node, a second electrode of the eighth output transistor is connected to the second power supply terminal, and a gate of the eighth output transistor is connected to the fourth output node;

the ninth output transistor is a P-type transistor, a first electrode of the ninth output transistor is connected to the first power supply terminal, a second electrode of the ninth output transistor is connected to the second output terminal, and a gate of the ninth output transistor is connected to the fifth output node; and the tenth output transistor is an N-type transistor, a first electrode of the tenth output transistor is connected to the second output terminal, a second electrode of the tenth output transistor is connected to the second power supply terminal, and a gate of the tenth output transistor is connected to the fifth output node.

8. A method for controlling a shift register, applicable for controlling the shift register according to claim 1, wherein a display cycle comprises an input phase, an output phase and a reset phase sequentially, and the method for controlling the shift register comprises:

in the input phase, providing, by the input circuit, a first level to the intermediate circuit based on a first level provided by the input voltage terminal and a second level provided by the first clock signal terminal, outputting, by the intermediate circuit, a second level to the output circuit based on a second level provided by the second clock signal terminal and a first level provided by the input circuit, and outputting, by the output circuit, a second level to the first output terminal and a first level to the second output terminal based on a second level provided by the intermediate circuit;

in the output phase, providing, by the input circuit, a first level to the intermediate circuit based on a second level provided by the input voltage terminal and a second level provided by the first clock signal terminal, outputting, by the intermediate circuit, a first level to the output circuit based on a first level provided by the second clock signal terminal and a first level provided by the input circuit, and outputting, by the output circuit, a first level to the first output terminal and a second level to the second output terminal based on a first level provided by the intermediate circuit; and in the reset phase, providing, by the input circuit, a second level to the intermediate circuit based on a second level provided by the input voltage terminal and a first level provided by the first clock signal terminal, outputting, by the intermediate circuit, a second level to the output circuit based on a second level provided by the second clock signal terminal and a second level provided by the input circuit, and outputting, by the output circuit, a second level to the first output terminal and a first level to the second output terminal based on a second level provided by the intermediate circuit.

9. A gate drive circuit, comprising a shift register, wherein the shift register comprises: an input circuit, an intermediate circuit and an output circuit, the intermediate circuit being connected to the input circuit and the output circuit, wherein the input circuit is connected to a first power supply terminal, a second power supply terminal, an input voltage terminal and a first clock signal terminal, and the input circuit is configured to output an intermediate input signal to the intermediate circuit based on an input voltage signal provided by the input voltage terminal and a first clock signal provided by the first clock signal terminal;

the intermediate circuit is connected to the first power supply terminal, the second power supply terminal and a second clock signal terminal, and the intermediate circuit is configured to output a first node signal to the output circuit based on a second clock signal provided by the second clock signal terminal and the intermediate input signal; and the output circuit is connected to the first power supply terminal, the second power supply terminal, a first output terminal and a second output terminal, and the output circuit is configured to output a first output signal and a second output signal based on the first node signal, wherein a potential of the first output signal and a potential of the second output signal are opposite, wherein the input circuit comprises a first NAND gate and a second NAND gate, wherein a first input terminal of the first NAND gate is connected to the input voltage terminal, and a second input terminal of the first NAND gate is connected to an output terminal of the second NAND gate; and a first input terminal of the second NAND gate is connected to an output terminal of the first NAND gate, and a second input terminal of the second NAND gate is connected to the first clock signal terminal.

10. The gate drive circuit according to claim 9, comprising a plurality of cascaded shift registers, wherein except a first stage of shift register, an input voltage terminal of a current stage of shift register is connected to a first output terminal of a previous stage of shift register.

11. The gate drive circuit according to claim 10, comprising a first clock signal line, a second clock signal line, a third clock signal line, and a first shift register, a second shift register and a third shift register which are sequentially cascaded, wherein the first clock signal line is connected to a first clock signal terminal of the first shift register, and the third clock signal line is connected to a second clock signal terminal of the first shift register;

the second clock signal line is connected to a first clock signal terminal of the second shift register, and the first clock signal line is connected to a second clock signal terminal of the second shift register; and the third clock signal line is connected to a first clock signal terminal of the third shift register, and the second clock signal line is connected to a second clock signal terminal of the third shift register.

12. A display panel, comprising a pixel circuit and a gate drive circuit, wherein the gate drive circuit comprises a shift register, wherein the shift register comprises: an input circuit, an intermediate circuit and an output circuit, the intermediate circuit being connected to the input circuit and the output circuit, wherein the input circuit is connected to a first power supply terminal, a second power supply terminal, an input voltage terminal and a first clock signal terminal, and the input circuit is configured to output an intermediate input signal to the intermediate circuit based on an input voltage signal provided by the input voltage terminal and a first clock signal provided by the first clock signal terminal;

the intermediate circuit is connected to the first power supply terminal, the second power supply terminal and a second clock signal terminal, and the intermediate circuit is configured to output a first node signal to the output circuit based on a second clock signal provided by the second clock signal terminal and the intermediate input signal; and the output circuit is connected to the first power supply terminal, the second power supply terminal, a first output terminal and a second output terminal, and the output circuit is configured to output a first output signal and a second output signal based on the first node signal, wherein a potential of the first output signal and a potential of the second output signal are opposite; and the pixel circuit and the gate drive circuit are connected to each other such that the gate drive circuit provides the first output signal and the second output signal to the pixel circuit, wherein the input circuit comprises a first NAND gate and a second NAND gate, wherein a first input terminal of the first NAND gate is connected to the input voltage terminal, and a second input terminal of the first NAND gate is connected to an output terminal of the second NAND gate; and a first input terminal of the second NAND gate is connected to an output terminal of the first NAND gate, and a second input terminal of the second NAND gate is connected to the first clock signal terminal.

13. The display panel according to claim 12, wherein the pixel circuit comprises a first transistor, a second transistor, a third transistor, a storage capacitor, a fourth transistor, a fifth transistor, a sixth transistor, a seventh transistor and a light-emitting element, wherein a first electrode of the first transistor is connected to a first data line, a second electrode of the first transistor is connected to a first electrode of the second transistor, and a gate of the first transistor is connected to a first gate line, the first gate line being configured to receive the first output signal provided by the shift register;

one terminal of the storage capacitor is connected to a first power line, and the other terminal of the storage capacitor is connected to a gate of the second transistor;

a first electrode of the third transistor is connected to the gate of the second transistor, a second electrode of the third transistor is connected to a second electrode of the second transistor, and a gate of the third transistor is connected to a second gate line, the second gate line being configured to receive the second output signal provided by the shift register;

a first electrode of the fourth transistor is connected to an initial power line, a second electrode of the fourth transistor is connected to the gate of the second transistor, and a gate of the fourth transistor is connected to a reset control line, the reset control line being configured to receive the second output signal provided by the shift register;

a gate of the fifth transistor is connected to a light emission control line, a first electrode of the fifth transistor is connected to the first power line, and a second electrode of the fifth transistor is connected to the first electrode of the second transistor;

a gate of the sixth transistor is connected to the light emission control line, a first electrode of the sixth transistor is connected to the second electrode of the second transistor, a second electrode of the sixth transistor is connected to one end of the light-emitting element, and the other end of the light-emitting element is connected to the second power line; and a first electrode of the seventh transistor is connected to the initial power line, a second electrode of the seventh transistor is connected to the second electrode of the sixth transistor, and a gate of the seventh transistor is connected to the first gate line, the first gate line being configured to receive the first output signal provided by the shift register.

14. The display panel according to claim 13, wherein the first transistor, the second transistor, the fifth transistor, the sixth transistor and the seventh transistor are P-type transistors, and the third transistor and the fourth transistor are N-type transistors.

15. The gate drive circuit according to claim 9, wherein the intermediate circuit comprises an inverter circuit and a control circuit, wherein the inverter circuit is connected to the first power supply terminal and the second power supply terminal, and the inverter circuit is configured to output a second node signal and a third node signal to the control circuit based on the intermediate input signal, wherein a potential of the second node signal and a potential of the third node signal are opposite; and the control circuit is connected to the second clock signal terminal, the first power supply terminal and the second power supply terminal, and the control circuit is configured to output the first node signal to the output circuit based on the second clock signal provided by the second clock signal terminal, the second node signal and the third node signal.

16. The gate drive circuit according to claim 15, wherein the inverter circuit comprises a first inverter and a second inverter, wherein an input terminal of the first inverter is connected to an output terminal of the input circuit, and the first inverter is configured to output the second node signal based on the intermediate input signal; and an input terminal of the second inverter is connected to an output terminal of the first inverter, and the second inverter is configured to output the third node signal based on the second node signal.

17. The gate drive circuit according to claim 15, wherein the control circuit comprises a control transistor and a transmission gate, wherein a gate of the control transistor is connected to the output terminal of the first inverter, a first electrode of the control transistor is connected to the first power supply terminal, and a second electrode of the control transistor is connected to an output terminal of the intermediate circuit; and an input terminal of the transmission gate is connected to the second clock signal terminal, a first control terminal of the transmission gate is connected to a second node, a second control terminal of the transmission gate is connected to a third node, and an output terminal of the transmission gate is connected to the output terminal the intermediate circuit.

18. The gate drive circuit according to claim 9, wherein the output circuit comprises a first output sub-circuit connected to the first power supply terminal and the second power supply terminal, and the first output sub-circuit comprises a third inverter and a fourth inverter, wherein an input terminal of the third inverter is connected to a first node, an output terminal of the third inverter is connected to an input terminal of the fourth inverter, and an output terminal of the fourth inverter is connected to the first output terminal.

* * * * *